US012672389B2

(12) United States Patent (10) Patent No.: US 12,672,389 B2
Thostenson et al. (45) Date of Patent: Jun. 30, 2026

(54) VERTICAL TETHERS FOR MICRO-TRANSFER PRINTING

(71) Applicant: X-Celeprint Limited, Dublin (IE)

(72) Inventors: James O. Thostenson, Durham, NC (US); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 269 days.

(21) Appl. No.: 18/120,397

(22) Filed: Mar. 12, 2023

(65) Prior Publication Data

US 2024/0304748 A1 Sep. 12, 2024

(51) Int. Cl.
*H10W 78/00* (2026.01)
*H10F 71/00* (2025.01)
*H10F 77/30* (2025.01)
*H10H 20/01* (2025.01)
*H10H 20/84* (2025.01)

(52) U.S. Cl.
CPC ......... *H10H 20/018* (2025.01); *H10F 71/139* (2025.01); *H10F 77/306* (2025.01); *H10H 20/84* (2025.01); *H10H 20/034* (2025.01); *Y10T 428/24033* (2015.01); *Y10T 428/24174* (2015.01); *Y10T 428/24752* (2015.01); *Y10T 428/24777* (2015.01)

(58) Field of Classification Search
CPC .... H10H 20/018; H10H 20/84; H10H 20/034; H10F 71/139; H10F 77/306; Y10T 428/24033; Y10T 428/24174; Y10T 428/24752; Y10T 428/24777
USPC .......................................................... 428/78
See application file for complete search history.

(56) References Cited

U.S. PATENT DOCUMENTS

| | | | |
|---|---|---|---|
| 7,622,367 B1 | 11/2009 | Nuzzo et al. | |
| 8,506,867 B2 | 8/2013 | Menard | |
| 8,722,458 B2 | 5/2014 | Rogers et al. | |
| 8,889,485 B2 | 11/2014 | Bower | |
| 9,520,537 B2 | 12/2016 | Bower et al. | |
| 10,224,231 B2 | 3/2019 | Bower et al. | |
| 10,832,934 B2 * | 11/2020 | Trindade | H01L 24/97 |
| 10,832,935 B2 * | 11/2020 | Bower | H01L 21/67144 |
| 2016/0093600 A1 | 3/2016 | Bower et al. | |

(Continued)

OTHER PUBLICATIONS

Cok, R. S. et al., AMOLED displays with transfer-printed integrated circuits, Journal of SID, 19(4):335-341, (2011).

*Primary Examiner* — Donald M Flores, Jr.

(74) *Attorney, Agent, or Firm* — Choate, Hall & Stewart LLP; Michael D. Schmitt

(57) ABSTRACT

A micro-transfer-printable component source structure includes a source wafer comprising an anchor portion, a sacrificial portion disposed on only a portion of the source wafer adjacent to the anchor portion, a component disposed directly and exclusively over the sacrificial portion, and a vertical tether physically connecting the component to the source wafer. The vertical tether extends from the component along a side of the sacrificial portion to the anchor portion and includes a vertical portion that extends in a direction at least partially orthogonal to a surface of the source wafer. The vertical portion can be between the component and the source wafer or adjacent to the component. Components with vertical tethers require less area on the source wafer and can be micro-transfer printed to a target substrate in closer alignment.

17 Claims, 30 Drawing Sheets

(56)         References Cited

U.S. PATENT DOCUMENTS

2018/0204973 A1*  7/2018  Jeung .................. H10H 20/825
2018/0226287 A1     8/2018  Bower et al.
2020/0176286 A1*  6/2020  Rotzoll ................. H10N 30/88
2023/0178611 A1*  6/2023  Raring .................. H10D 86/60
                                                                    438/31

* cited by examiner

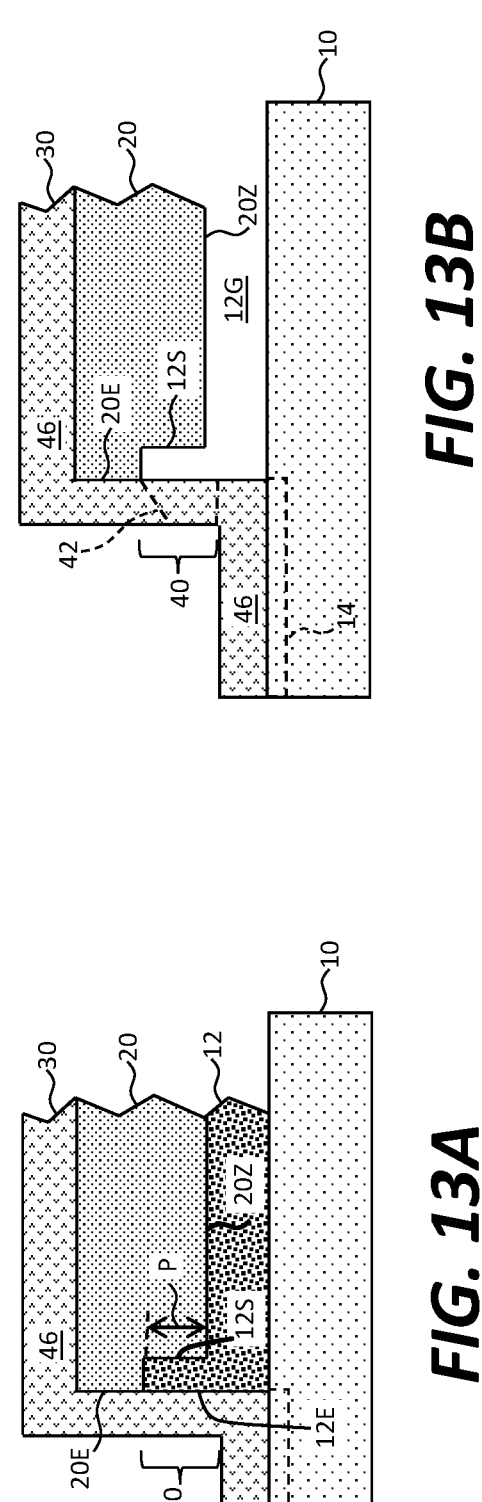
FIG. 13A
FIG. 13B
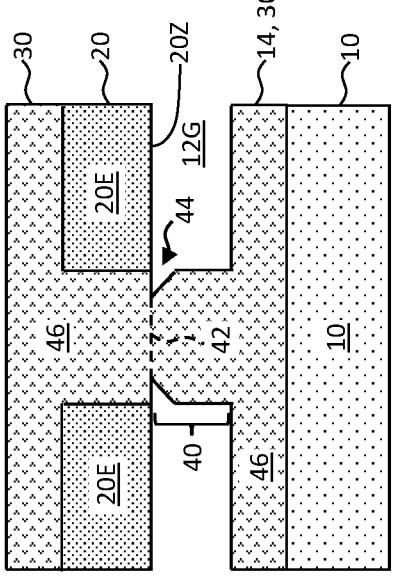
FIG. 14

VERTICAL TETHERS FOR MICRO-TRANSFER PRINTING

TECHNICAL FIELD

The present disclosure relates to structures and methods for tethering released micro-transfer printable integrated circuits on source wafers.

BACKGROUND

Integrated circuits (ICs) are widely used in electronic devices. Integrated circuits are typically formed on a semiconductor wafer using photolithographic processes and then packaged, for example in a ceramic or plastic package, with pins or bumps on the package providing externally accessible electrical connections to the integrated circuit.

In some applications, the bare integrated circuit dies are not separately packaged but are placed directly on a destination substrate and electrically connected on the destination substrate, for example using photolithographic, integrated circuit, or printed-circuit-board methods, to form an electronic system. However, this can be difficult to accomplish when the integrated circuits are small. Thus, an efficient method for transferring bare dies from a relatively small and expensive source substrate (e.g., a crystalline semiconductor) to a relatively large and inexpensive destination substrate (e.g., amorphous glass, resin, or plastic) is very desirable, since the integrated circuits can provide much higher data processing efficiency than thin-film semiconductor structures formed on large substrates.

One approach to handling and placing small integrated circuits (chiplets) uses micro-transfer printing, for example as described in U.S. Pat. Nos. 8,722,458, 7,622,367 and 8,506,867, each of which is hereby incorporated by reference in its entirety. In these methods, an integrated circuit is formed on a source wafer, for example a semiconductor wafer, and undercut by etching a gap between a bottom side of the integrated circuit and the source wafer. A stamp contacts a top side of the integrated circuit to adhere the integrated circuit to the stamp, the stamp and integrated circuit are removed from the source wafer and transported to a target (destination) substrate, for example a semiconductor, glass, or plastic substrate, the integrated circuit is contacted and adhered to the target substrate, and the stamp removed to "print" the integrated circuit from the source wafer to the target substrate. Multiple integrated circuits can be "printed" in a common step with a single stamp. The integrated circuits can then be electrically connected using conventional photolithographic and printed-circuit board methods. This technique has the advantage of locating many (e.g., tens of thousands to millions) small integrated circuit devices on a target substrate in a single print step. For example, U.S. Pat. No. 8,722,458 teaches transferring light-emitting, light-sensing, or light-collecting semiconductor elements from a wafer substrate to a destination substrate using a patterned elastomer stamp whose spatial pattern matches the location of the semiconductor elements on the wafer substrate.

The micro-transfer printing process requires constructing releasable (micro-transfer-printable) integrated circuits on a source substrate. The releasable integrated circuits are typically formed using photolithographic methods and materials. There is a need, however, for improvements in processes and structures for making robust releasable integrated circuit in a reliable, efficient, and cost-effective manner.

SUMMARY

In an embodiment of the present disclosure, among other things, a micro-transfer-printable component source structure (e.g., a component source wafer comprising components suitable for micro-transfer printing) comprises a source wafer having a source-wafer surface comprising an anchor portion, a sacrificial portion comprising a sacrificial material disposed on only a portion of the source-wafer surface adjacent to the anchor portion, the sacrificial portion having a sacrificial-portion side extending along a sacrificial-portion edge of the sacrificial portion in a direction at least partially orthogonal to the source-wafer surface, a component at least partially disposed on the sacrificial portion, the component having a component side extending along a component edge of the component in a direction at least partially orthogonal to the source-wafer surface, and a vertical tether physically connecting the component to the source-wafer surface, the vertical tether extending from the component along the sacrificial-portion side to the anchor portion and comprising a vertical portion that extends in a direction at least partially orthogonal to the source-wafer surface. The component can be disposed directly and exclusively on the sacrificial portion or is disposed directly and exclusively on the sacrificial portion in combination with the vertical portion.

In some embodiments, the component comprises a component material and the source wafer comprises a source wafer material that is the same as the component material. In some embodiments, the component edge extends at an angle no less than 45 degrees from the source-wafer surface. In some embodiments, the component edge extends orthogonally from the source-wafer surface.

In some embodiments, the sacrificial-portion edge extends at an angle no less than 45 degrees from the source-wafer surface. In some embodiments, the sacrificial-portion edge extends orthogonally from the source-wafer surface. In some embodiments, the sacrificial portion comprises a sacrificial portion material and the component comprises a component material that is differentially etchable from the sacrificial portion material. In some embodiments, the sacrificial portion comprises a sacrificial portion material and the source wafer comprises a source wafer material that is differentially etchable from the sacrificial portion material.

In some embodiments, the vertical tether extends along and on at least a part of the source-wafer surface. In some embodiments, the vertical tether extends along and in contact with some but less than all of the component side. In some embodiments, the vertical tether has a sacrificial portion width on at least a portion of the sacrificial-portion side that is narrower than a component width on at least a portion of the component side. In some embodiments, the vertical tether has a first width on at least a portion of the sacrificial-portion side that is narrower than a second width on at least a portion of the sacrificial-portion side. In some embodiments, the vertical tether comprises an inorganic material, an organic material, or comprises layers comprising organic and inorganic materials. In some embodiments, the vertical tether comprises silicon oxide, silicon nitride, an epoxy, polyimide, or a photoresist. In some embodiments, the vertical portion is adjacent to the component or wherein the vertical portion is directly between the component and the source wafer.

According to embodiments of the present disclosure, a micro-transfer-printable component source structure comprises a source wafer having a source-wafer surface comprising an anchor portion, a component, and a tether physically connecting the component to the anchor portion, the tether comprising a vertical portion that extends in a direction at least partially orthogonal to the source-wafer surface. In embodiments, the component is suspended over the source wafer by the tether such that the component is separated from the source wafer by the vertical portion. The vertical portion can be disposed directly between the component and the source wafer.

According to some embodiments of the present disclosure, a micro-transfer-printable component source structure comprises a source wafer comprising an anchor portion, a sacrificial portion disposed on only a portion of the source wafer adjacent to the anchor portion, a component at least partially disposed on the sacrificial portion, and a vertical tether physically connecting the component to the source wafer. The vertical tether can extend from the component along a side of the sacrificial portion to the anchor portion and can include a vertical portion that extends in a direction at least partially orthogonal to a surface of the source wafer. The component can be disposed directly and exclusively on the sacrificial portion or can be disposed directly and exclusively on the sacrificial portion in combination with the vertical portion. The vertical portion can be adjacent to the component or the vertical portion can be directly between the component and the source wafer.

According to some embodiments of the present disclosure, a method of making a micro-transfer-printable component source structure comprises providing a source wafer having a source-wafer surface, disposing a sacrificial portion on the source-wafer surface, the sacrificial portion extending over only a portion of the source-wafer surface and having a sacrificial-portion side extending along a sacrificial-portion edge of the sacrificial portion in a direction at least partially orthogonal to the source-wafer surface, disposing a component at least partially on the sacrificial portion, the component having a component side extending along a component edge of the component in a direction at least partially orthogonal to the source-wafer surface, and forming a vertical tether physically connecting the component to the source-wafer surface, the vertical tether extending along and in contact with the component side and the sacrificial-portion side. The component can be disposed directly and exclusively on the sacrificial portion or can be disposed directly and exclusively on the sacrificial portion in combination with the vertical portion.

Some methods according to the present disclosure comprise contacting the component with a stamp to adhere the component to the stamp and removing the component from the source wafer with the stamp to fracture the vertical tether. Methods can comprise breaking (e.g., fracturing) the vertical tether between the component and the source-wafer surface in a direction orthogonal to the source-wafer surface. The step of disposing the sacrificial portion on the source-wafer surface can comprise disposing a sacrificial layer over the source-wafer surface and patterning the sacrificial layer to form the sacrificial portion. The step of forming the vertical tether can comprise coating an encapsulation layer over the component and the source-wafer surface and patterning the encapsulation layer to form the vertical tether.

Embodiments of the present disclosure include a micro-transfer-printed component target structure comprising a target substrate having a target-substrate surface, a component disposed on the target substrate, the component having a component side extending along a component edge of the component in a direction at least partially orthogonal to the target-substrate surface, and a vertical tether standoff extending from the component to the target-substrate surface and comprising a vertical portion that extends in a direction at least partially orthogonal to the target-substrate surface that prevents a bottom surface of the component from contacting the target-substrate surface. The vertical tether standoff can comprise a broken (e.g., fractured) or separated end in contact with the target-substrate surface or a layer disposed on the target-substrate surface.

Embodiments of the present disclosure comprise a mechanical structure disposed on or in the target substrate having a mechanical-structure side that extends in a direction at least partly orthogonal to the target-substrate surface. The vertical tether standoff can be in contact with the mechanical-structure side or an adhesive layer disposed on at least a portion of the mechanical structure. The mechanical structure can comprise a first optical structure, the component can comprise a second optical structure, and the first optical structure can be in alignment with the second optical structure. The first optical structure can be a light pipe or the second optical structure can be a light pipe. The first optical structure can be a light emitter or a light sensor or the second optical structure can be a light emitter or a light sensor. In some embodiments, the first optical structure or the second optical structure is a laser, a light-emitting diode, a photodiode, an optical amplifier, or an optical modulator. The mechanical structure can extend away from the target substrate in a direction at least partly orthogonal to the target-substrate surface. The mechanical structure can be comprised in a cavity extending into the target substrate and the component can be disposed in the cavity.

In embodiments, the vertical portion can be adjacent to the component, or the vertical portion can be directly between the component and the source wafer. The vertical tether standoff can be in contact with a bottom surface of the component or can be in contact with the component side.

According to embodiments of the present disclosure, a method of making a micro-transfer-printable target structure comprises providing a target substrate having a target-substrate surface, providing a component reversibly adhered to a stamp, the component having a component side extending along a component edge of the component in a direction at least partially orthogonal to the target-substrate surface, providing a vertical tether standoff extending from the component to the target-substrate surface and comprising a vertical portion in a direction at least partially orthogonal to the target-substrate surface, contacting the vertical tether standoff to the target substrate or a layer disposed on the target substrate with the stamp to adhere the vertical tether standoff to the target-substrate surface, and removing the stamp, leaving the vertical tether standoff adhered to the target substrate. The layer can be an adhesive layer and the vertical tether standoff can be adhered to the target substrate with the adhesive layer. The layer can be an adhesive layer and the component can be adhered to the target substrate with the adhesive layer.

Contacting the vertical tether standoff to the target substrate can comprise moving the stamp vertically until the vertical tether standoff contacts the target substrate and then moving the stamp and component horizontally.

Embodiments can comprise a mechanical structure disposed on or in the target substrate and contacting the vertical tether standoff to the target substrate can comprise moving the stamp horizontally until the vertical tether standoff contacts the mechanical structure and then moving the stamp and component vertically to contact the vertical tether standoff to the target substrate.

According to embodiments of the present disclosure, a micro-transfer-printable component source structure comprises a source wafer comprising an anchor portion, a sacrificial portion comprising a sacrificial material and having a top side and a bottom side, wherein the bottom side of the sacrificial portion is disposed on the source wafer, a component disposed at least partially on the top side of the sacrificial portion, and a breakable or separable tether that physically connects the component to the anchor portion. The tether can comprise a vertical portion that extends vertically along a third side of the sacrificial portion from the bottom side to the top side. The tether can be breakable or separable at the vertical portion when the component is picked-up with a transfer element (e.g., stamp). The third side of the sacrificial portion can be sloped. The vertical portion can extend horizontally as well as vertically. The vertical portion can also be adjacent to the component. The vertical portion can also be disposed directly between the component and the source wafer.

The tether can extend along and on at least a part of the source-wafer. The tether can extend along and in contact with some but less than all of a top side of the component. The tether can comprise an inorganic material, an organic material, or can comprise layers comprising organic and inorganic materials. The tether can comprise silicon oxide, silicon nitride, an epoxy, polyimide, or a photoresist. The tether can also extend along a side of the component. The tether can extend along the source wafer (e.g., over the anchor portion or to the anchor portion).

In some embodiments, the sacrificial portion comprises a sacrificial portion material and the component comprises a component material that is differentially etchable from the sacrificial portion material. The sacrificial portion can comprise a sacrificial portion material and the source wafer can comprise a source wafer material that is differentially etchable from the sacrificial portion material.

The tether can comprise a sacrificial-portion portion disposed on the sacrificial portion and a component portion disposed on the component; the sacrificial-portion portion can be narrower than the component portion. In some embodiments, the tether comprises a first portion and a second portion, each disposed on the sacrificial portion, and the first portion is narrower than the second portion. The component can comprise a component material and the source wafer can comprise a source wafer material that is the same as the component material.

In embodiments, the component is disposed directly and exclusively on only the sacrificial portion. In embodiments, the component is disposed directly and exclusively on only the sacrificial portion and the vertical portion. In some embodiments, the sacrificial portion is a non-native patterned layer disposed on the source wafer.

The present disclosure provides structures and methods for efficiently forming robust releasable integrated circuits for micro-transfer printing in a cost-effective manner.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 4A:
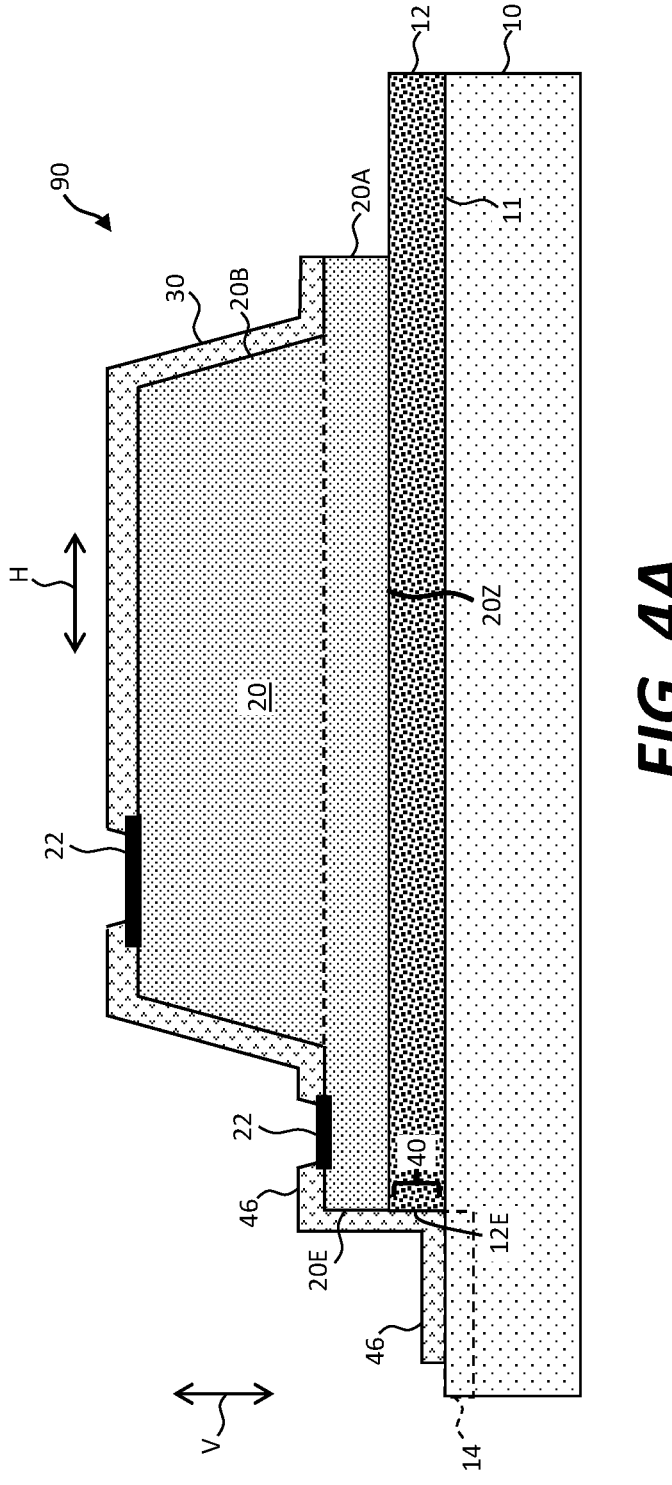
Figure 4B:
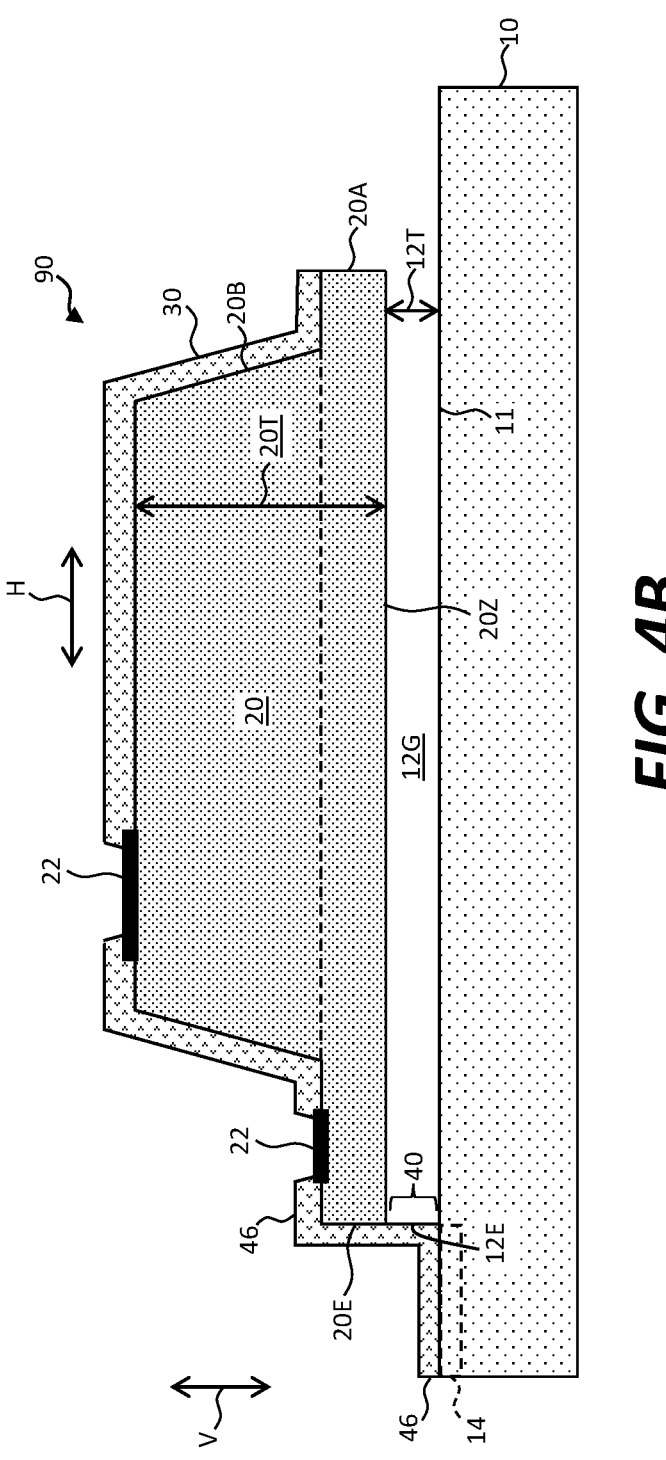
Figure 5B:
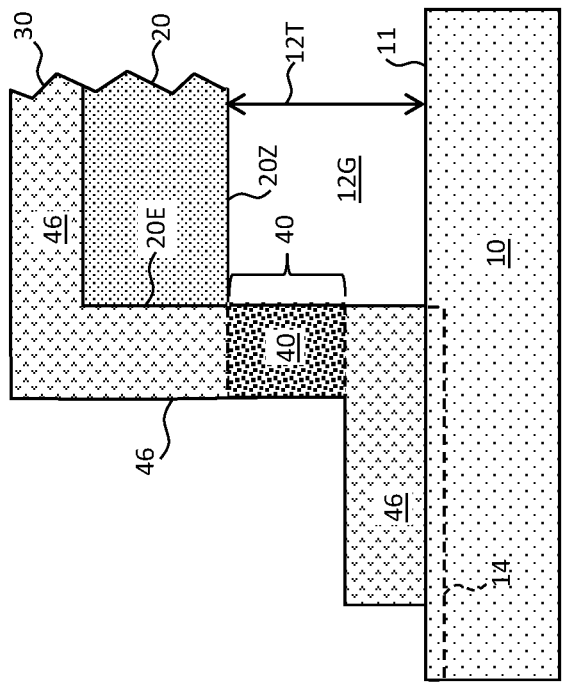
Figure 5A:
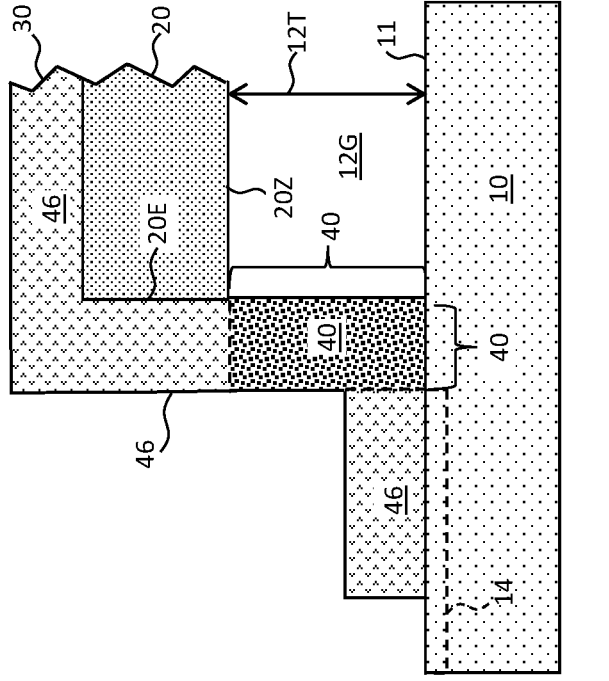
Figure 6:
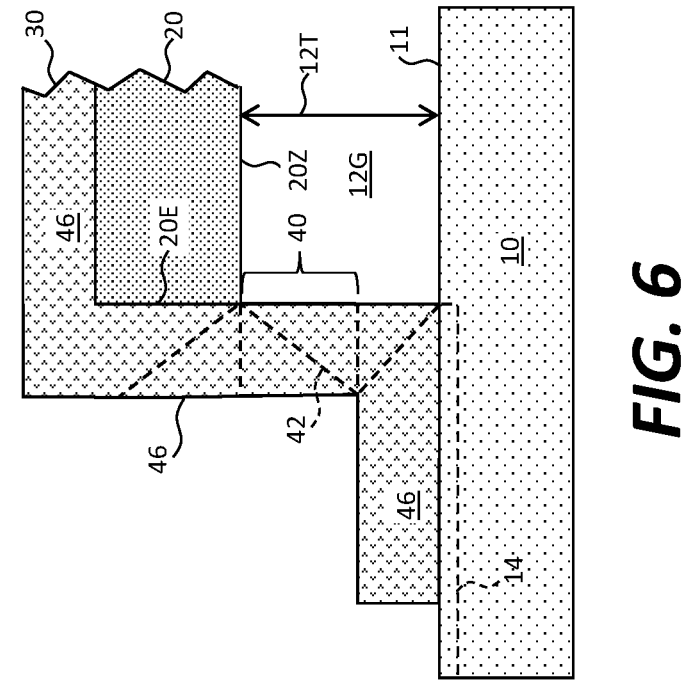
Figure 5C:
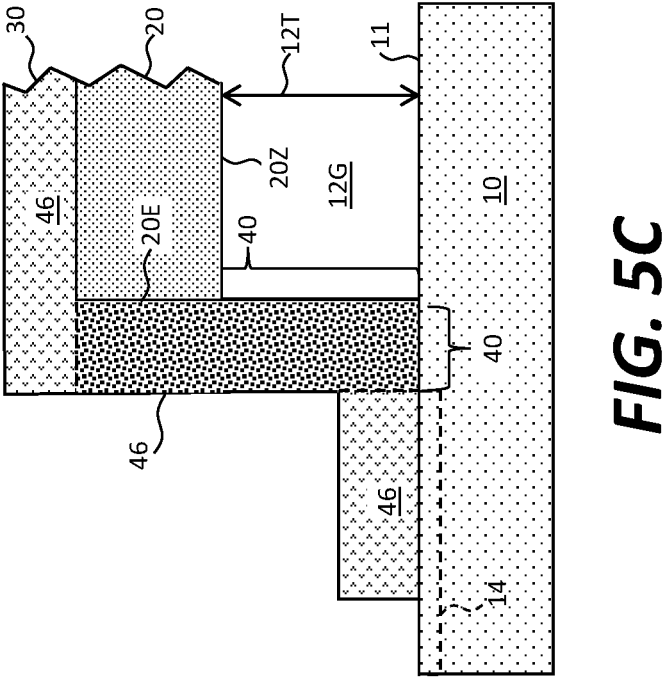
Figures 7A, 7B:
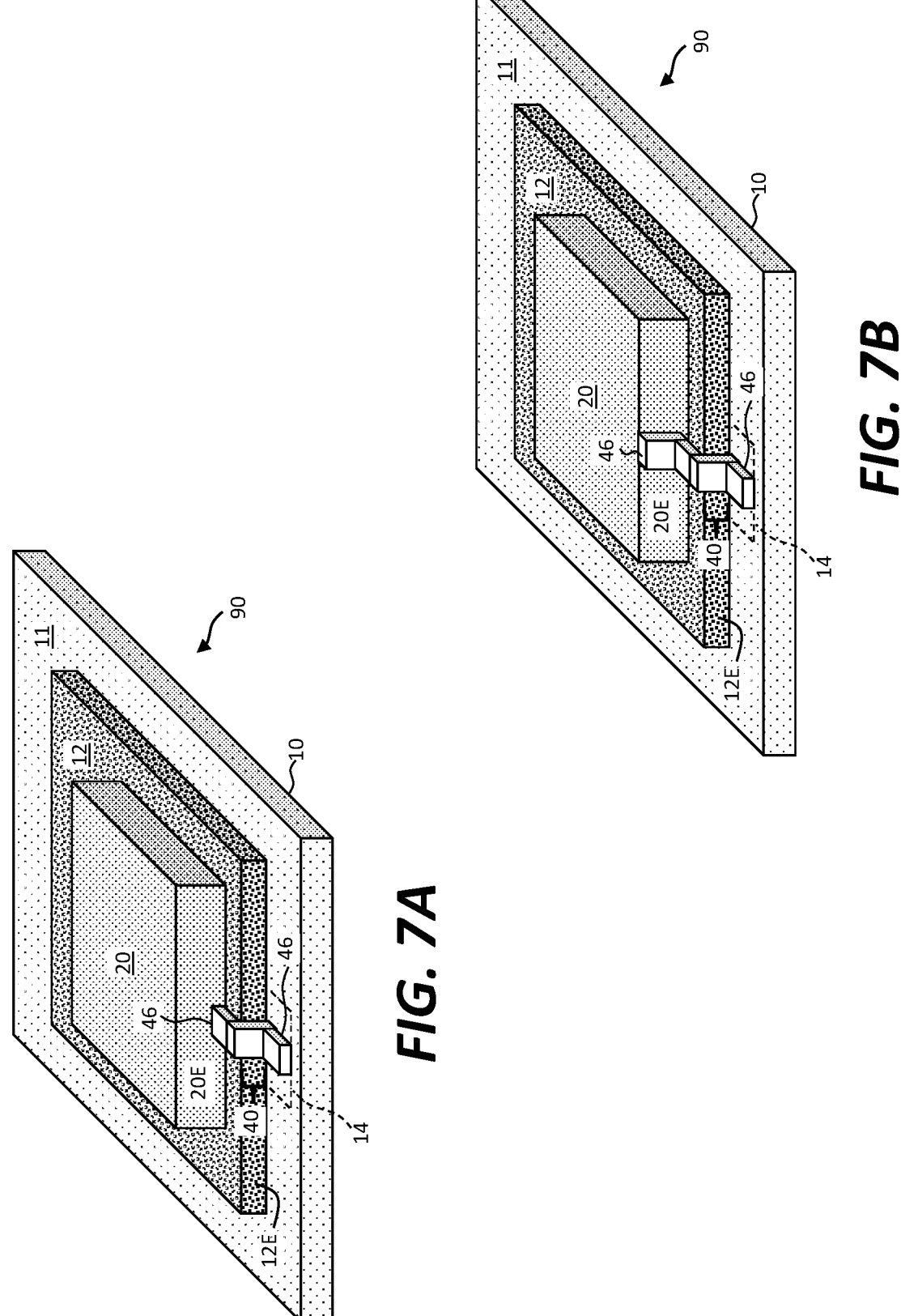
Figure 7C:
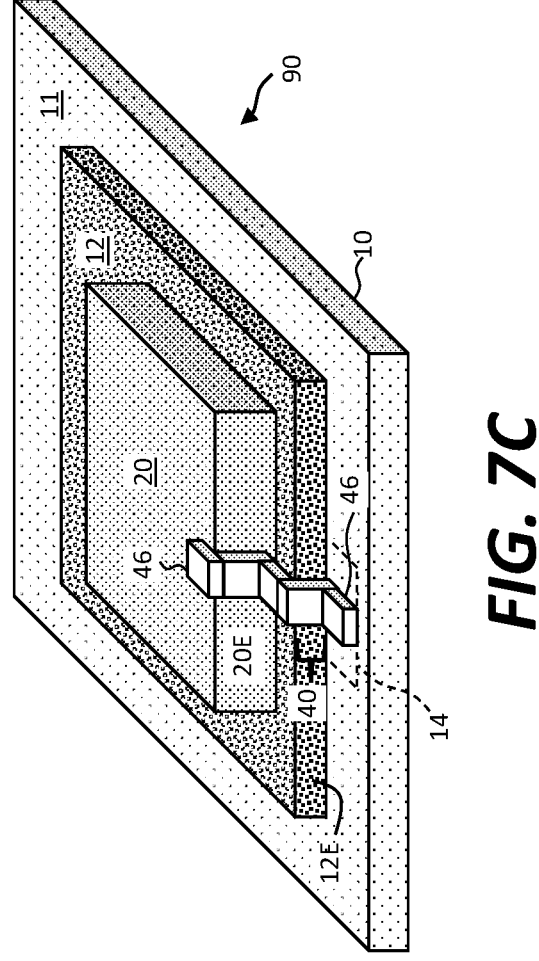
Figures 8A, 8B:
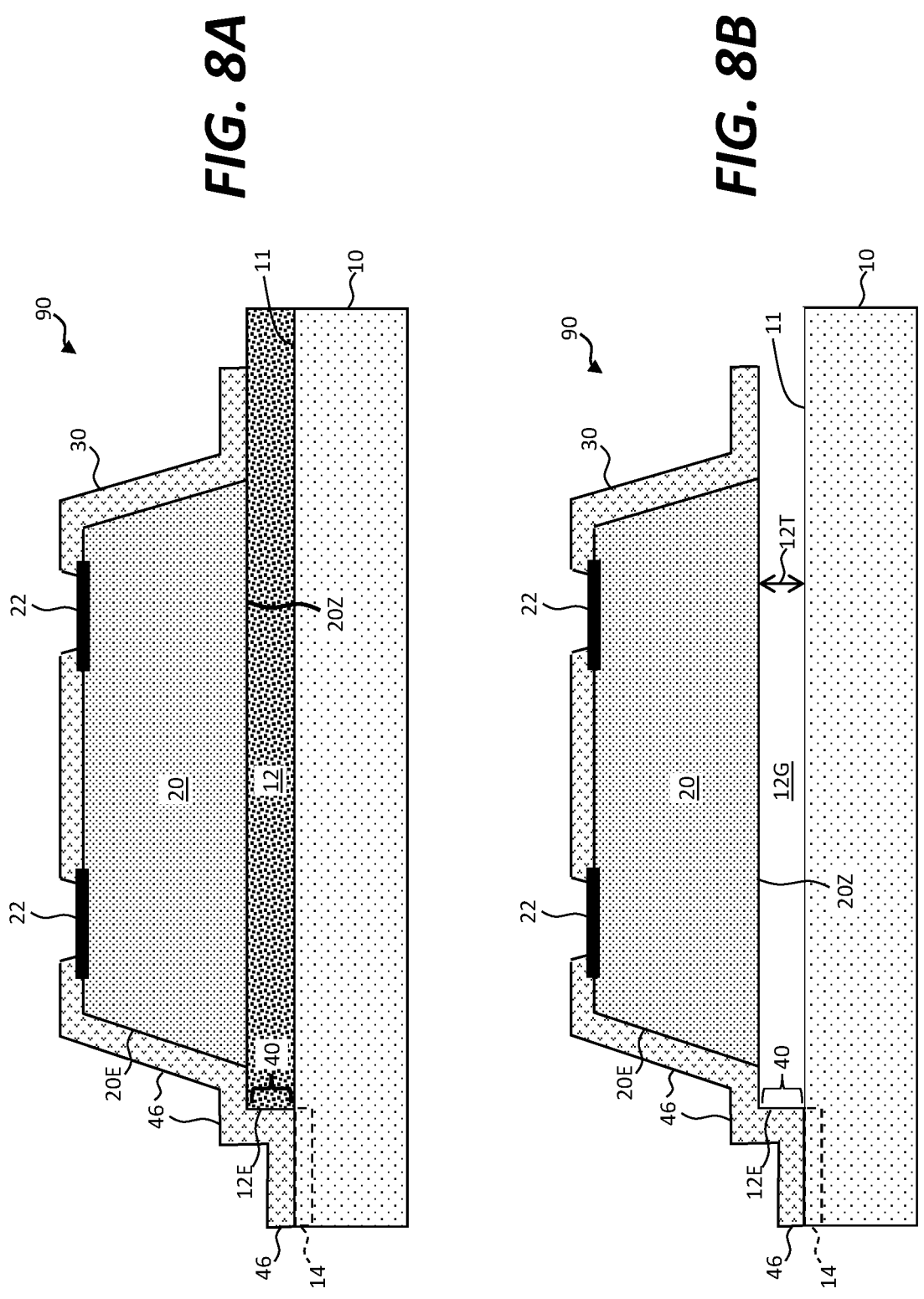
Figure 9B:
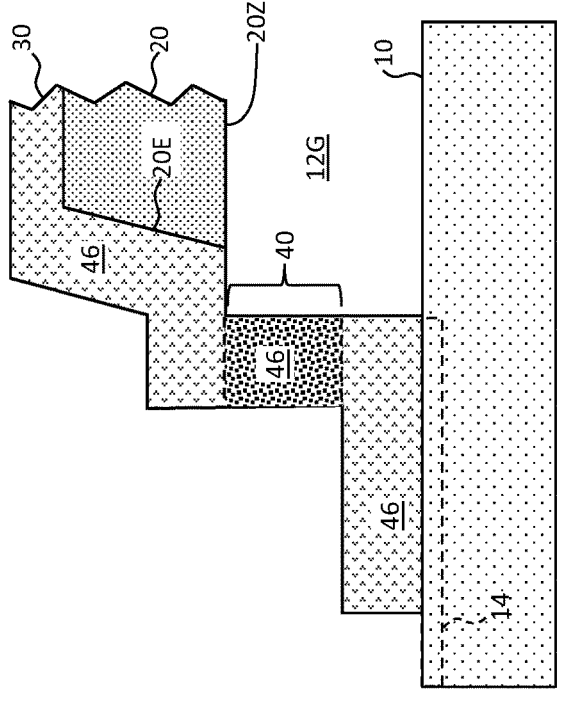
Figure 9A:
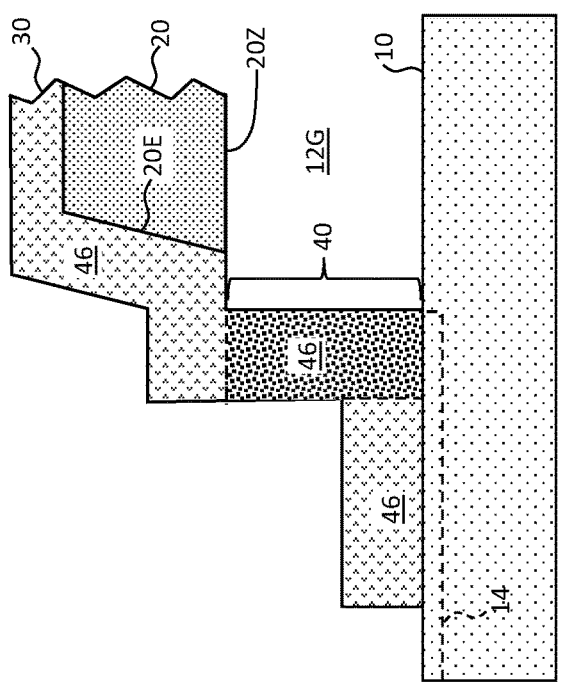
Figure 10:
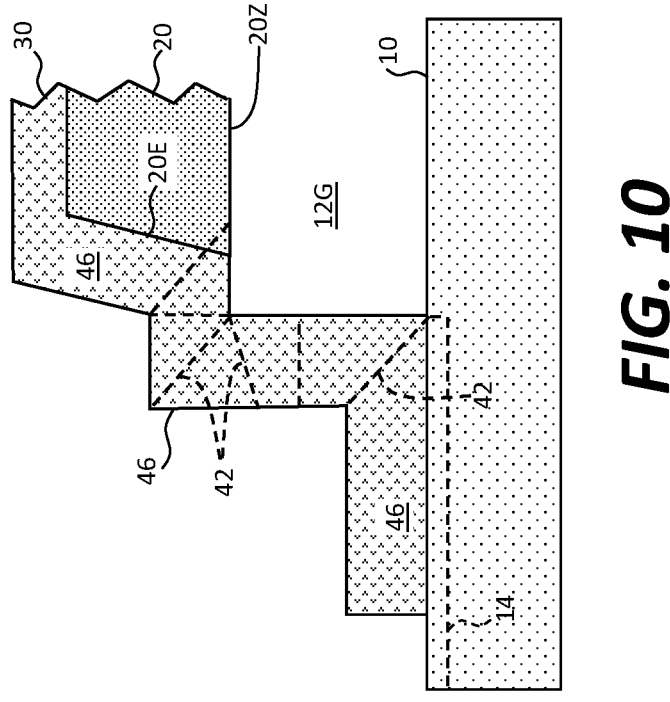
Figure 9C:
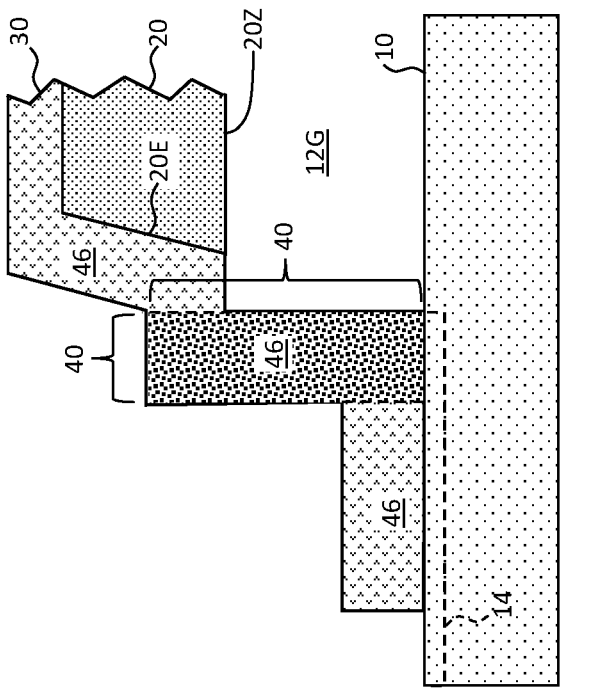
Figures 11A, 11B:
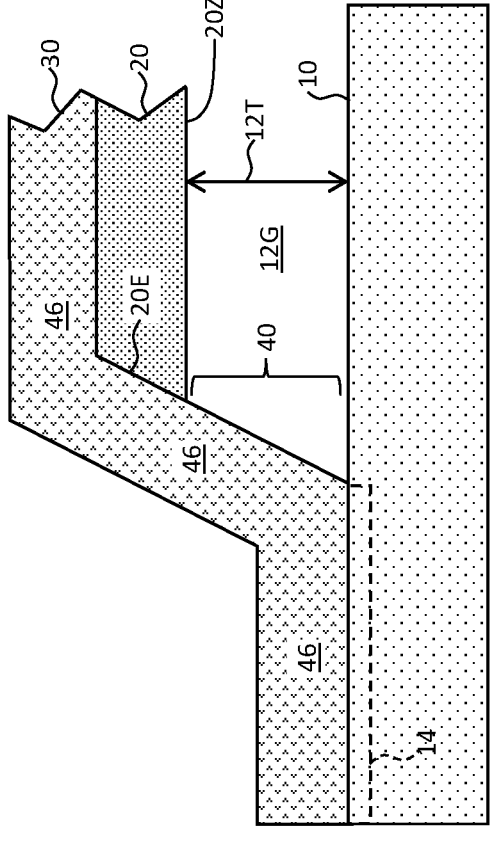
Figures 12A, 12B:
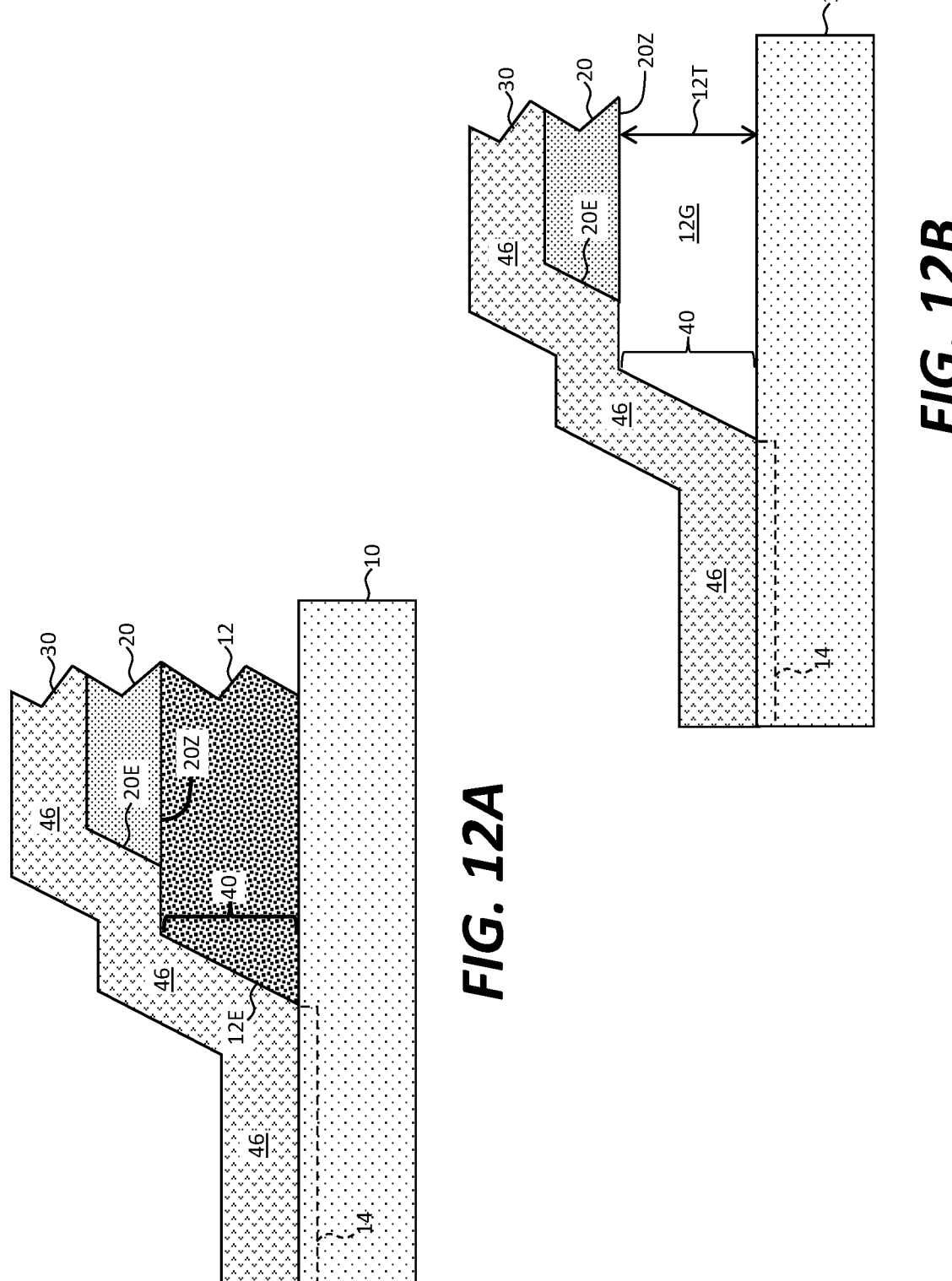
Figure 15A:
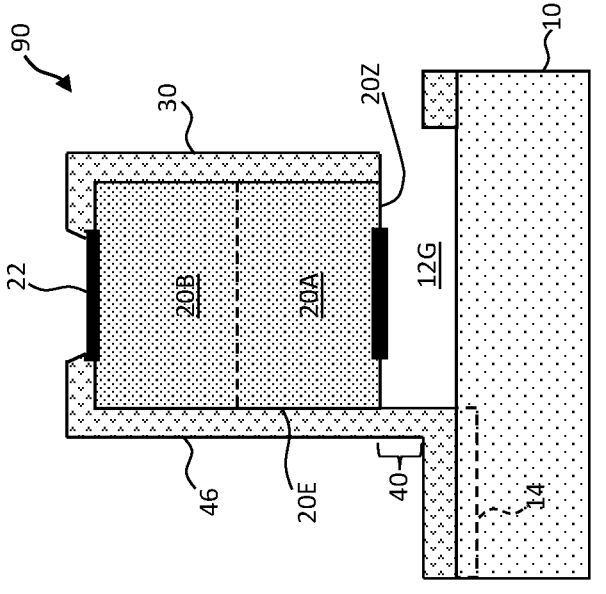
Figure 15B:
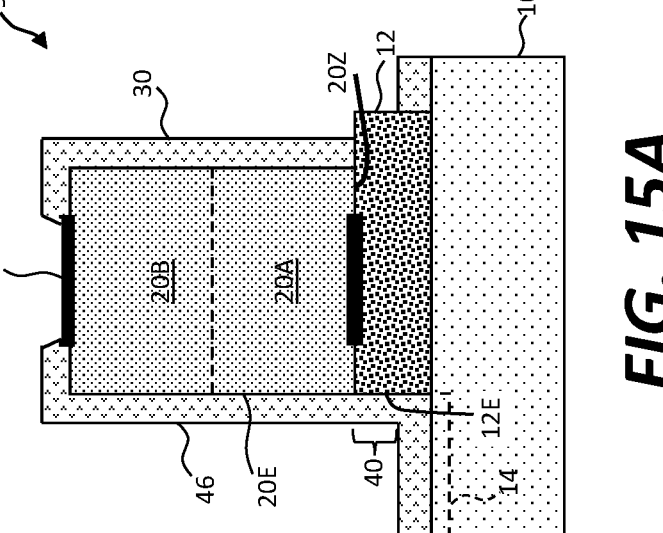
Figure 17:
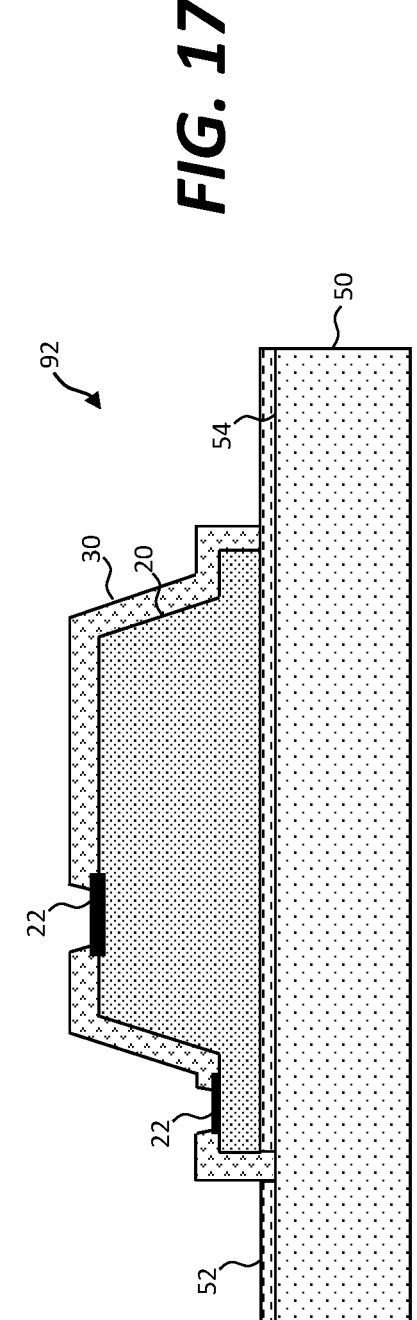
Figure 18:
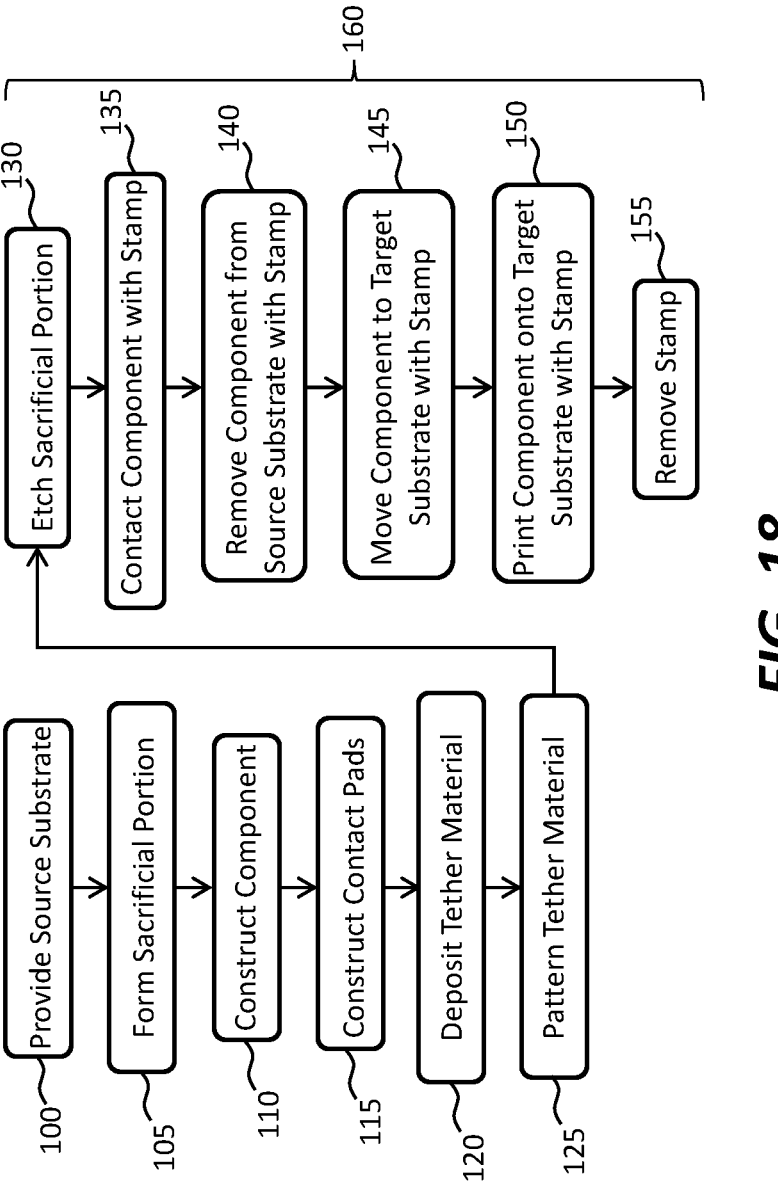
Figure 21:
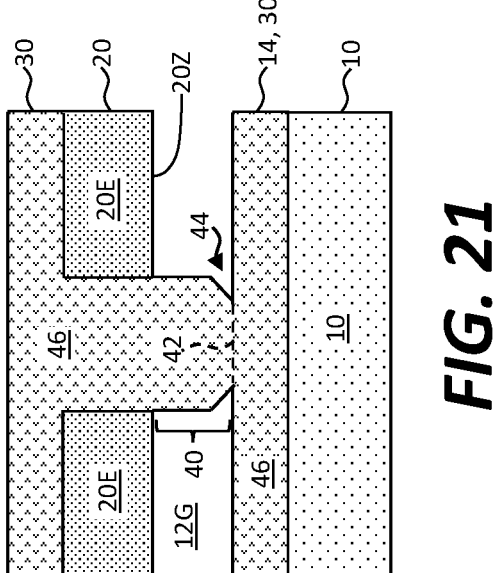
Figure 20:
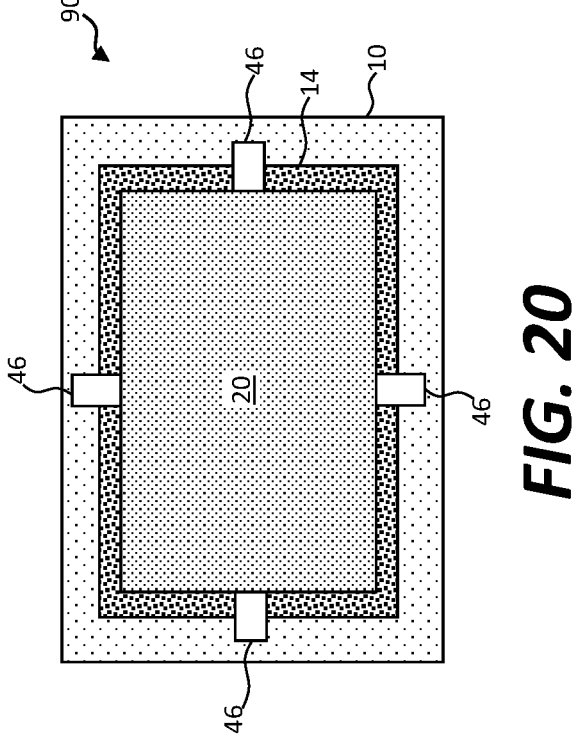
Figures 22, 23:
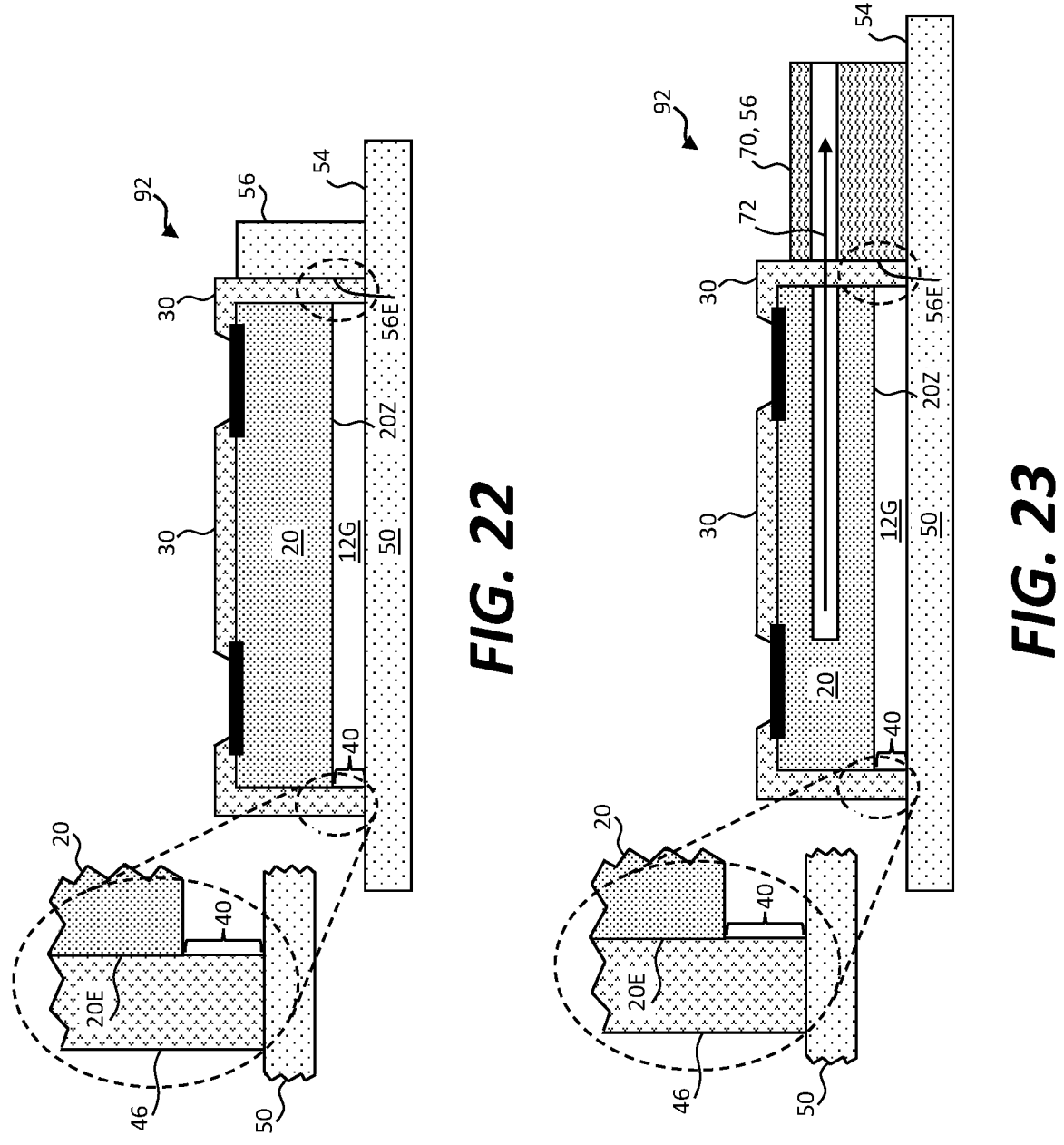
Figure 24:
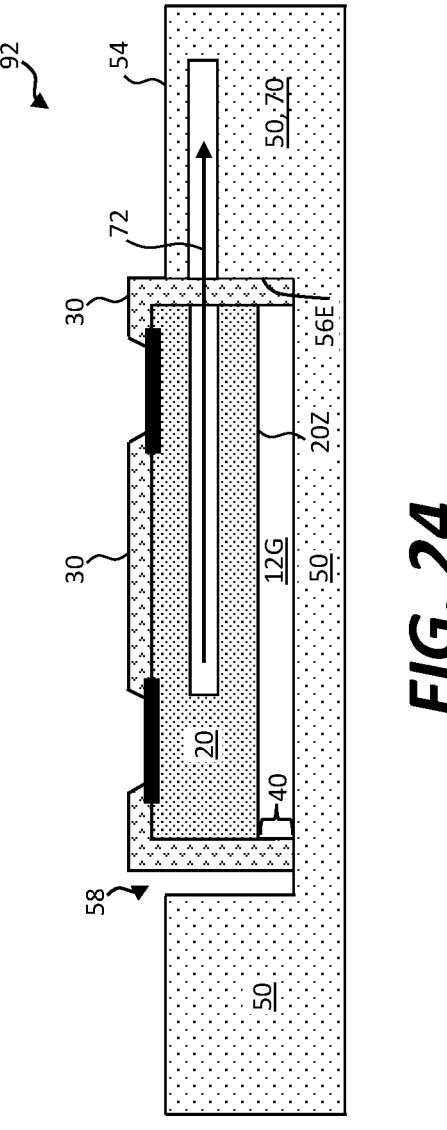
Figures 25A, 25B:
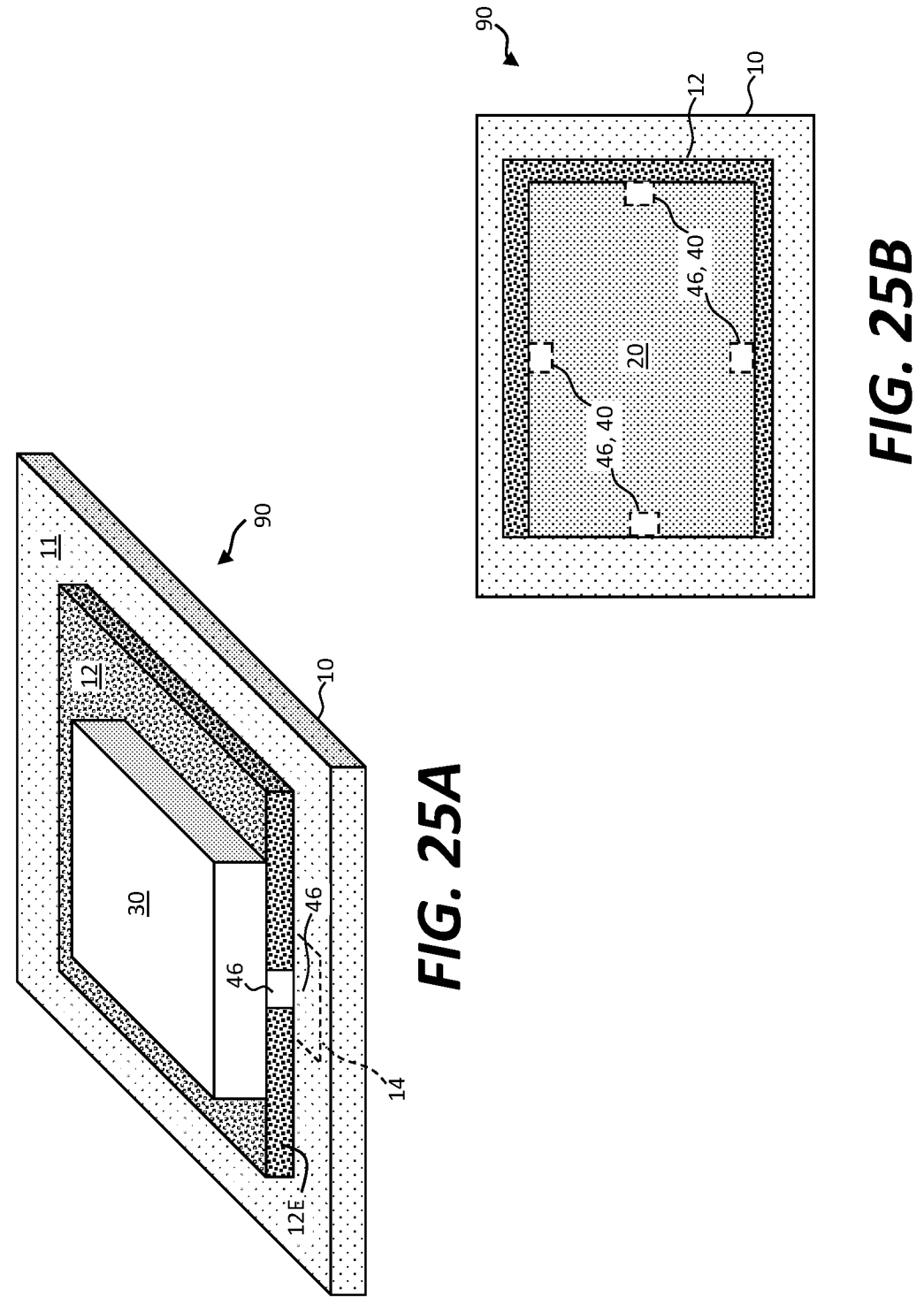
Figure 25D:
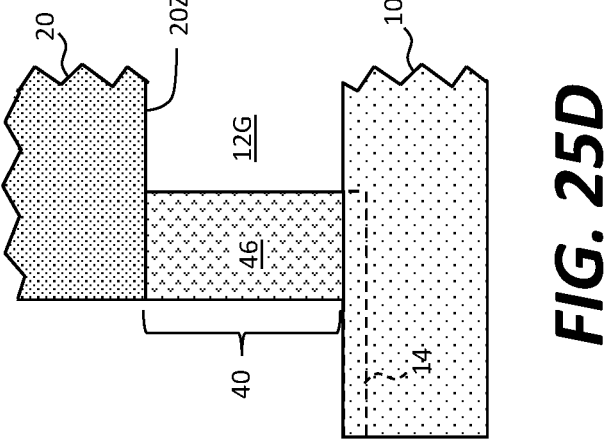
Figure 25C:
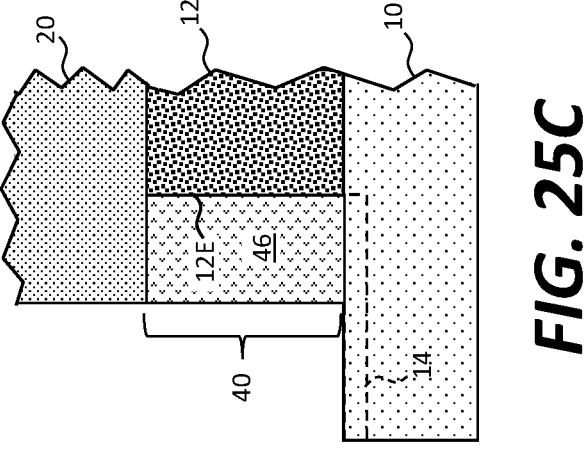
Figure 26:
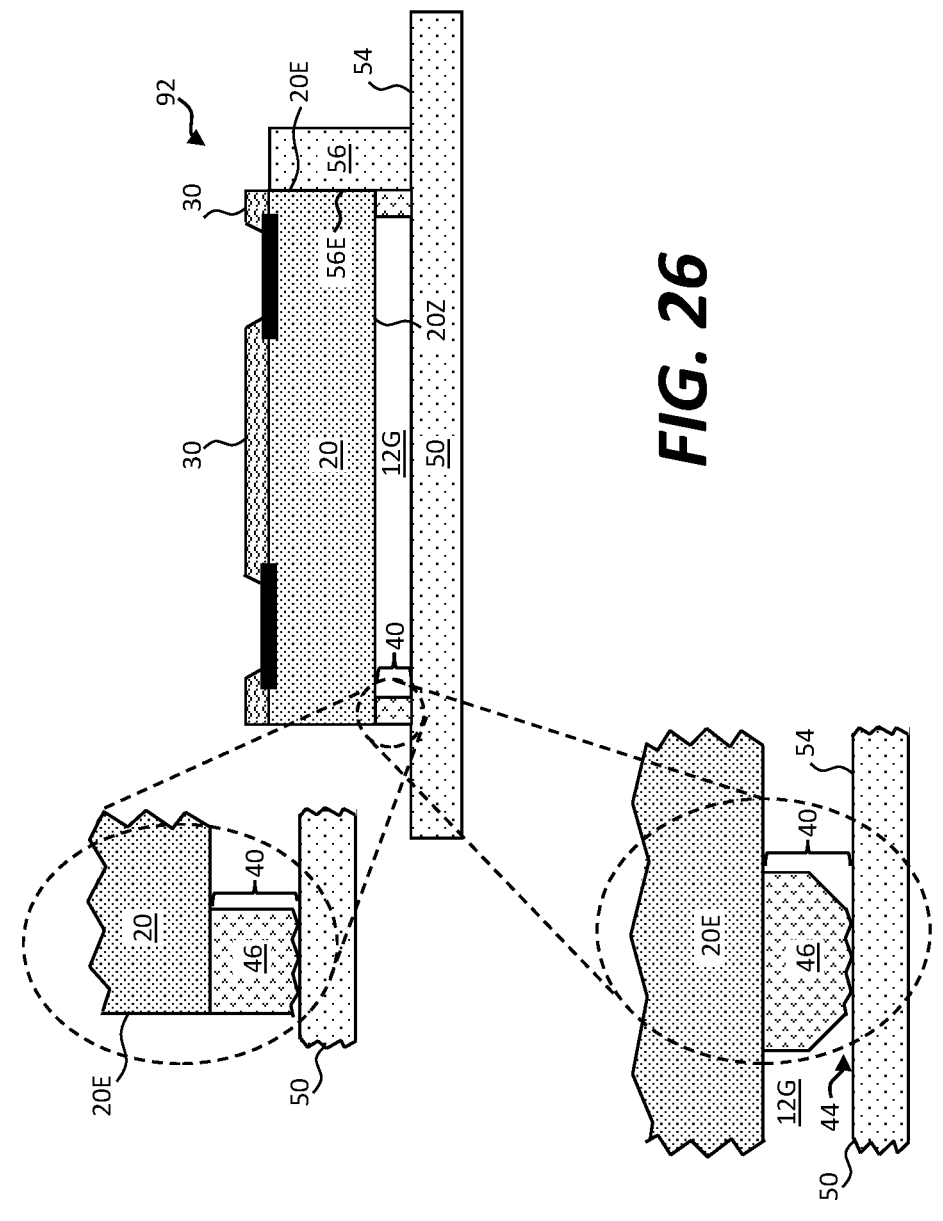
Figure 27B:
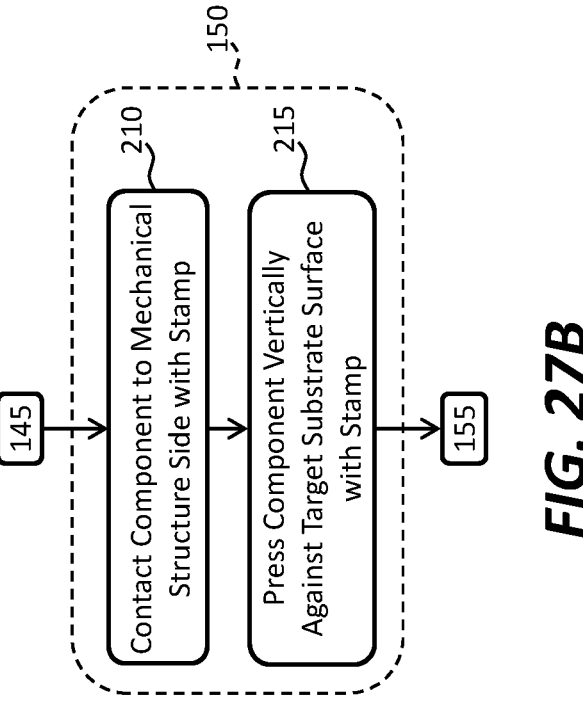
Figure 27A:
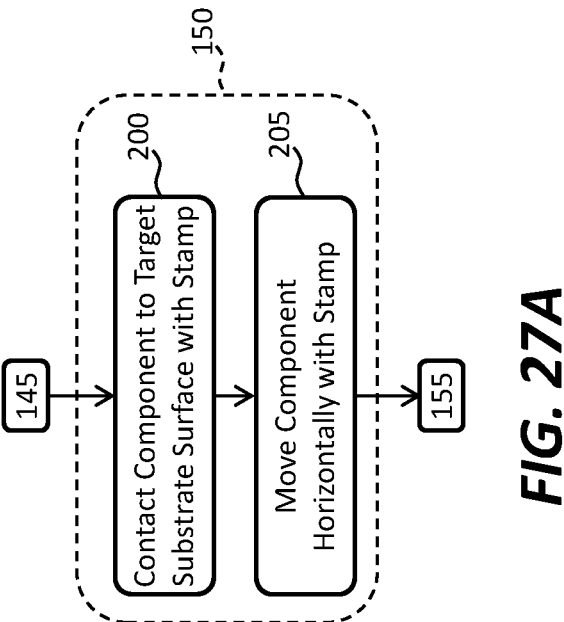

6 portion, a component, and a vertical tether according to illustrative embodiments of the present disclosure;

FIG. 4A is a cross section of a micro-transfer-printable component source structure with a source wafer, a sacrificial portion comprising sacrificial material, a component, and a vertical tether according to illustrative embodiments of the present disclosure;

FIG. 4B is a cross section of a micro-transfer-printable component source structure with a source wafer, an etched sacrificial portion forming a gap, a component, and a vertical tether according to illustrative embodiments of the present disclosure;

FIGS. 5A-5C are cross sections of a vertical tether detail with vertical portions shown according to illustrative embodiments of the present disclosure;

FIG. 6 is a cross section of a vertical tether detail with various vertical tether fracture lines shown according to illustrative embodiments of the present disclosure;

FIGS. 7A-7C are perspectives of a micro-transfer-printable component source structure with a source wafer, a sacrificial portion, a component offset from an edge of the sacrificial portion, and a vertical tether according to illustrative embodiments of the present disclosure;

FIG. 8A is a cross section of a micro-transfer-printable component source structure with a source wafer, a sacrificial portion comprising sacrificial material offset from a component, a component, and a vertical tether according to illustrative embodiments of the present disclosure;

FIG. 8B is a cross section of a micro-transfer-printable component source structure with a source wafer, an etched sacrificial portion forming a gap offset from a component, a component, and a vertical tether according to illustrative embodiments of the present disclosure;

FIGS. 9A-9C are cross sections of a vertical tether detail with vertical portions shown according to illustrative embodiments of the present disclosure;

FIG. 10 is a cross section of a vertical tether detail with various fracture lines shown according to illustrative embodiments of the present disclosure;

FIG. 11A is a cross section of a vertical tether detail with a sacrificial portion comprising sacrificial material and a component having angled edges according to illustrative embodiments of the present disclosure;

FIG. 11B is a cross section of a vertical tether detail with an etched sacrificial portion forming a gap and a component having angled edges according to illustrative embodiments of the present disclosure;

FIG. 12A is a cross section of a vertical tether detail with a sacrificial portion comprising sacrificial material and a component offset from the sacrificial portion having angled edges according to illustrative embodiments of the present disclosure;

FIG. 12B is a cross section of a vertical tether detail with an etched sacrificial portion forming a gap and a component offset from the sacrificial portion having angled edges according to illustrative embodiments of the present disclosure;

FIG. 13A is a cross section of a vertical tether detail with a sacrificial portion having a stepped edge comprising sacrificial material according to illustrative embodiments of the present disclosure;

FIG. 13B is a cross section of a vertical tether detail with an etched sacrificial portion having a stepped edge forming a bi-level gap according to illustrative embodiments of the present disclosure;

FIG. 14 is a cross section end view of a vertical tether detail with a necked vertical portion according to illustrative embodiments of the present disclosure;

FIG. 15A is a cross section of a micro-transfer-printable component source structure with a vertical component according to illustrative embodiments of the present disclosure;

FIG. 15B is a cross section of a micro-transfer-printable component source structure corresponding to FIG. 15A with an etched sacrificial portion forming a gap according to illustrative embodiments of the present disclosure;

FIGS. 16A-16K are successive cross sections of structures made in accordance with illustrative methods of the present disclosure;

FIG. 17 is a cross section of a micro-transfer-printed component target structure comprising a printed component on an adhesive layer coated on a target substrate according to illustrative embodiments of the present disclosure;

FIG. 18 is a flow diagram of methods according to illustrative embodiments of the present disclosure;

Figures 19A, 19B:
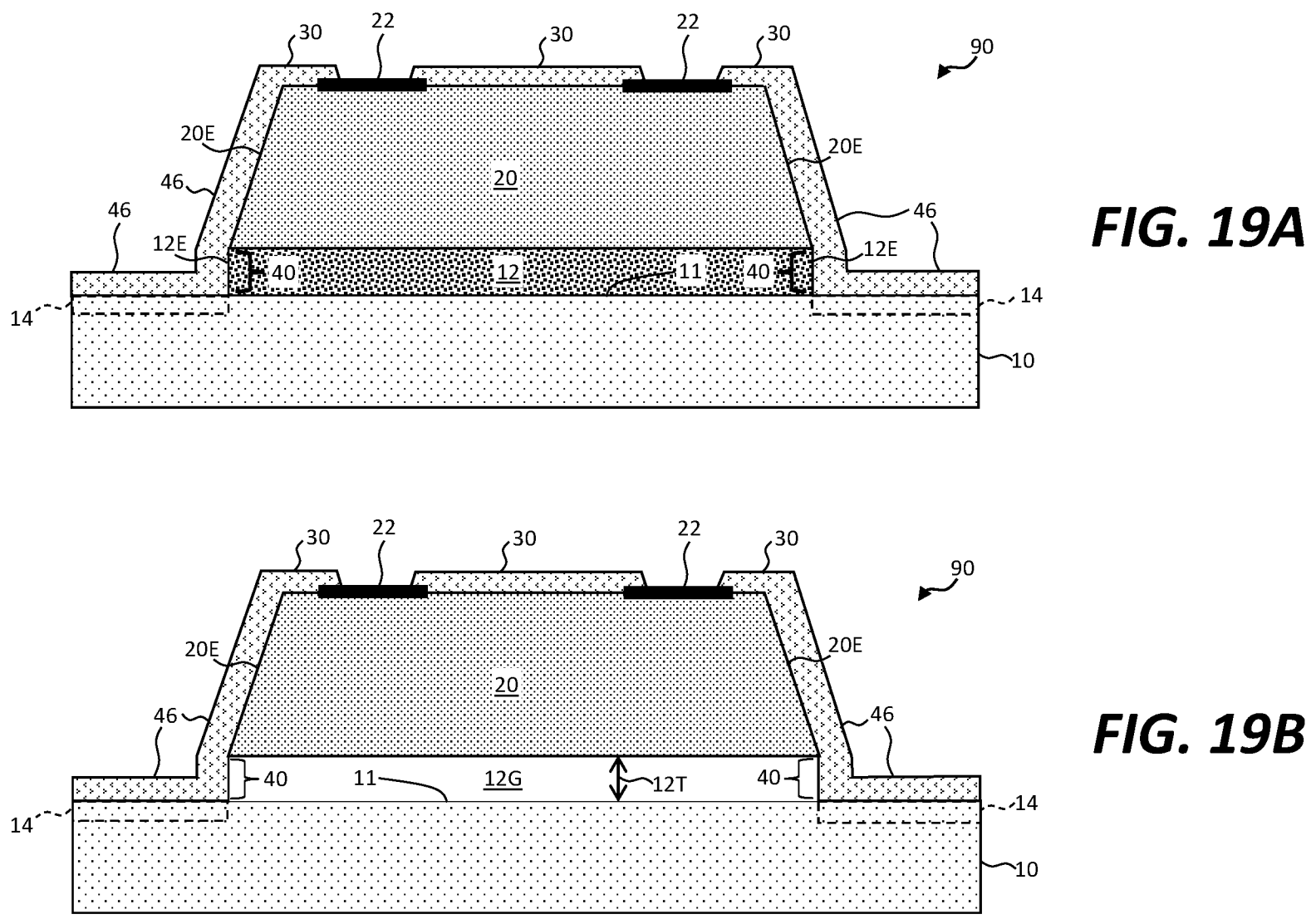

FIG. 19A is a cross section of a micro-transfer printable component source structure comprising a source wafer, a sacrificial portion comprising sacrificial materials, a component, and multiple vertical tethers according to illustrative embodiments of the present disclosure;

FIG. 19B is a cross section of a micro-transfer printable component source structure comprising a source wafer, an etched sacrificial portion forming a gap, a component, and multiple vertical tethers according to illustrative embodiments of the present disclosure;

FIG. 20 is a plan view of a micro-transfer printable component source structure comprising a source wafer, a sacrificial portion comprising sacrificial materials, a component, and multiple vertical tethers according to illustrative embodiments of the present disclosure;

FIG. 21 is a cross section end view of a vertical tether detail with a necked vertical portion according to illustrative embodiments of the present disclosure;

FIG. 22 is a cross section of a micro-transfer printed component with multiple vertical standoffs on a target substrate with a mechanical structure according to illustrative embodiments of the present disclosure;

FIG. 23 is a cross section of a micro-transfer printed component with multiple vertical standoffs on a target substrate with a light pipe according to illustrative embodiments of the present disclosure;

FIG. 24 is a cross section of a micro-transfer printed component with multiple vertical standoffs in a cavity in a target substrate with a light pipe according to illustrative embodiments of the present disclosure;

FIG. 25A is a perspective of a micro-transfer-printable component source structure with a source wafer, a sacrificial portion, a component with a component edge aligned in a common plane with a sacrificial-portion edge, and a vertical tether according to illustrative embodiments of the present disclosure;

FIG. 25B is a plan view of a micro-transfer-printable component source structure with a source wafer, a sacrificial portion comprising sacrificial material, a component, and a vertical tether according to illustrative embodiments of the present disclosure;

FIG. 25C is a cross section of a micro-transfer-printable component source structure with a source wafer, a sacrificial portion comprising sacrificial material, a component, and a vertical tether according to illustrative embodiments of the present disclosure;

FIG. 25D is a cross section of a micro-transfer-printable component source structure with a source wafer, an etched sacrificial portion forming a gap, a component, and a vertical tether according to illustrative embodiments of the present disclosure;

FIG. 26 is a cross section with side and end view details of a micro-transfer-printed component target structure comprising a printed component and multiple vertical tethers micro-transfer printed on a target substrate according to illustrative embodiments of the present disclosure; and FIGS. 27A and 27B are flow diagrams of methods according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Among other things, embodiments of the present disclosure provide structures and methods for efficiently forming robust releasable integrated circuits (components) and structures in or on a source wafer or source substrate for micro-transfer printing to a target (destination) substrate in a cost-effective manner. Embodiments can enable source wafers or source substrates with a greater density of micro-transfer-printable micro-devices made using fewer processing steps, thereby reducing costs for micro-systems made using micro-transfer printing. Some embodiments can also provide more robust structures with greater micro-transfer-printing yields for particular structures. In some implementations, components can be micro-transfer printed onto target substrates closer together or closer to structures formed on the target substrates.

Micro-transfer printing (dry transfer printing) can comprise removing a released or suspended component from a source wafer and transferring the removed component to a target (destination) substrate with a stamp, for example a visco-elastic stamp by contacting the stamp to the component on the source wafer to adhere the component to the stamp, removing the component from the source wafer (thereby fracturing or separating a tether physically connecting the component to an anchor portion of the source wafer), locating the component and stamp in alignment with the target substrate, pressing the component against the target substrate, and removing the stamp. In such a micro-transfer printing process, it is important that the tether fractures in a controlled manner in a high-yield manufacturing process.

Figure 1:
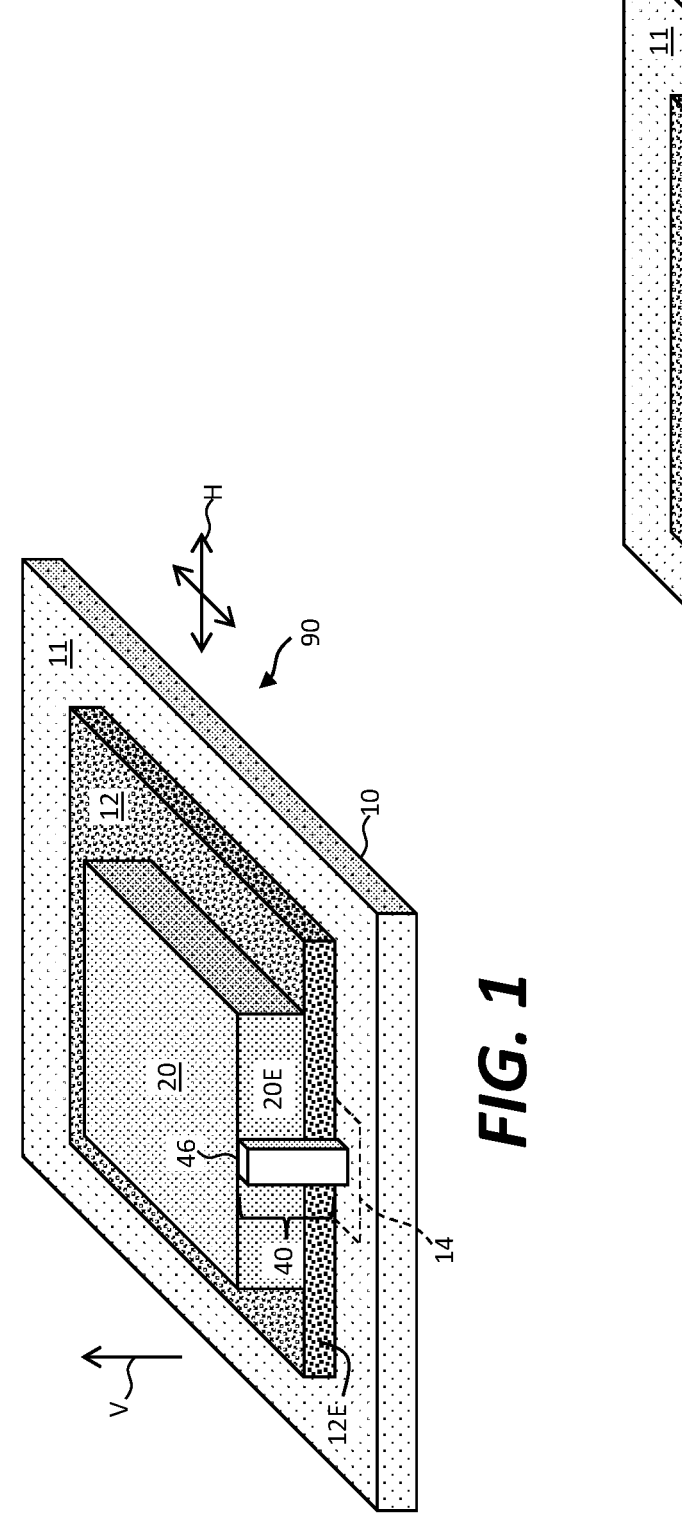
FIGS. 1-3 are perspectives of a micro-transfer-printable component source structure with a source wafer, a sacrificial
Figure 2:
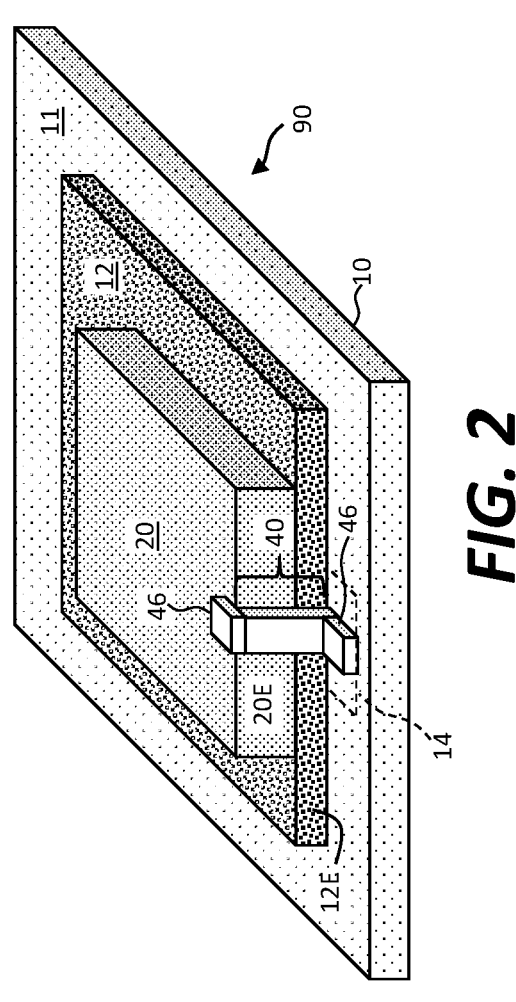
Figure 3:
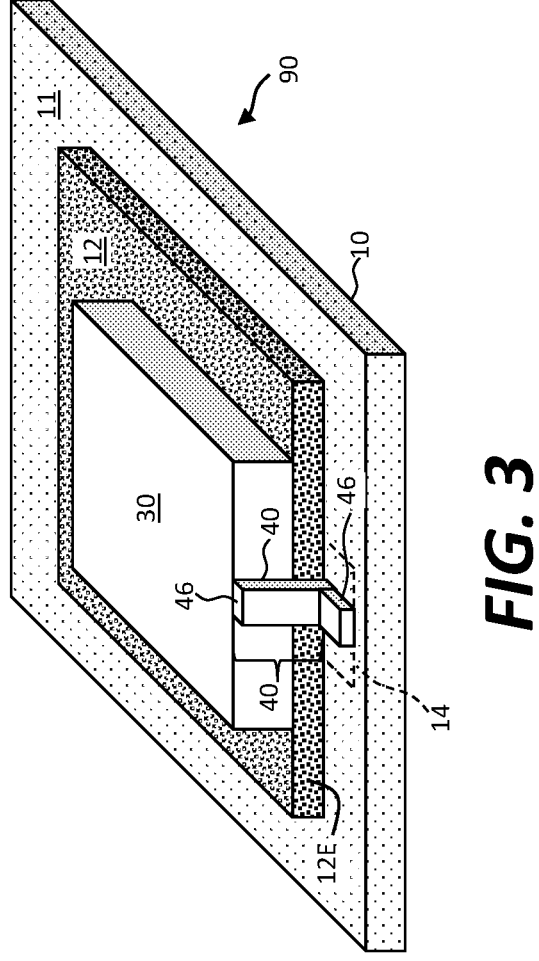

According to embodiments of the present disclosure and as illustrated in FIGS. 1-3, a micro-transfer-printable component source structure 90 can comprise a source wafer 10 having a source-wafer surface 11 comprising an anchor portion 14 (anchor 14), a sacrificial portion 12 comprising a patterned sacrificial material disposed on source-wafer surface 11 of source wafer 10, and a component 20 disposed on or over (e.g., in physical contact with, directly on and directly over) sacrificial portion 12. Micro-transfer-printable component source structure 90 can comprise a source wafer 10 (or source substrate) with a component 20 thereon that is structured for micro-transfer printing component 20. Source-wafer surface 11 can be a processing side of source wafer 10 and can define a horizontal surface H and a vertical direction V orthogonal to source-wafer surface 11. Anchor portion 14 of source-wafer surface 11 can be an area of source-wafer surface 11 and does not necessarily have a thickness (e.g., is a two-dimensional area). The area of source wafer 10 covered by sacrificial portion 12 is exclusive of anchor portion 14 so that anchor portion 14 and the area of source wafer 10 covered by sacrificial portion 12 do not overlap, e.g., sacrificial portion 12 is not directly on directly over, or directly above anchor portion 14. In some embodiments, anchor portion 14 is all of source-wafer surface 11 that is not the area of source-wafer surface 11 covered by sacrificial portion 12.

Sacrificial portion 12 is disposed over and on source-wafer surface 11 (e.g., covers a horizontal area of source-wafer surface 11 and extends in vertical direction V away from source wafer 10 and source-wafer surface 11 so that sacrificial portion 12 has a thickness and comprises a three-dimensional structure or space having a volume. Thus, sacrificial portion 12 can comprise a sacrificial material disposed on only a portion of the source-wafer surface 11 adjacent to anchor portion 14. Sacrificial portion 12 can have a sacrificial-portion side 12E extending along a sacrificial-portion edge 12E of sacrificial portion 12 in a direction at least partially orthogonal to source-wafer surface 11. Sacrificial portion 12 covers only a portion of source-wafer surface 11 (e.g., covers less than all of source-wafer surface 11). An area of substrate surface 11 covered by sacrificial portion 12 can be adjacent to and in contact with anchor portion 14 but does not overlap with anchor portion 14. As used herein, "adjacent to" means "does not overlap with" and can imply touching or is closer or closest to.

Component 20 can be disposed over and on sacrificial portion 12 (e.g., in vertical direction V directly over and directly above sacrificial portion 12 and source-wafer surface 11) and can extend away from sacrificial portion 12 and source-wafer surface 11 in vertical direction V, so that component 20 is a three-dimensional structure (e.g., has a volume). Component 20 can be directly and exclusively disposed over sacrificial portion 12 and can be in physical contact with sacrificial portion 12 so that every part of component 20 can be directly above and over (e.g., in vertical direction V) sacrificial portion 12. Component 20 can cover only a portion of sacrificial portion 12. Thus, sacrificial portion 12 can, but does not necessarily, extend beyond component 20 so that not all of sacrificial portion 12 is covered by component 20. Component 20 can have a component side 20E extending along a component edge 20E of component 20 in a direction at least partially orthogonal to source-wafer surface 11, e.g., at least somewhat in vertical direction V. Component 20 can be a micro-device and can be an electrical, optical, or electro-optic component, for example an integrated circuit or photonic element such as a laser, for example a vertical-cavity surface-emission laser (VCSEL).

One or more edges of component 20 can be aligned with an edge of sacrificial portion 12. As used herein, an edge (e.g., of component 20 or sacrificial portion 12) is a side that extends at least partially orthogonally to sacrificial portion 12 (e.g., in a vertical direction V). An edge or side of component 20 or sacrificial portion 12 can be substantially vertical (e.g., substantially orthogonal to source-wafer surface 11) but, according to embodiments of the present disclosure, is at least not entirely horizontal so that the edge or side of component 20 or sacrificial portion 12 extends at least partially away from source-wafer surface 11, e.g., in vertical direction V, and can define a thickness of at least a portion of component 20 or sacrificial portion 12. Component side 20E and sacrificial-portion side 12E can be in a common plane, can be in separate parallel planes, or can define separate planes.

According to embodiments of the present disclosure, a vertical tether 46 physically connects component 20 to source-wafer surface 11. Vertical tether 46 can extend from component 20 along and in direct physical contact with sacrificial-portion side 12E to anchor portion 14 on source-wafer surface 11. Moreover, vertical tether 46 can extend in direct physical contact with and along component side 20E. Component side 20E can extend in an at least partially vertical direction V. (As used herein, a direction that is at least partly or partially vertical includes a substantially vertical direction.) Vertical tether 46 comprises a vertical portion 40 that extends in a direction at least partially orthogonal to source-wafer surface 11 in vertical direction V. Vertical portion 40 of vertical tether 46 can be in physical contact (e.g., touching and in direct physical contact) with sacrificial-portion side 12E of sacrificial portion 12. Vertical tether 46 can also be in contact with a horizontal side of sacrificial portion 12 that is opposite source-wafer surface 11, for example a substantially horizontal surface parallel to source-wafer surface 11 and on which component 20 is disposed. Vertical portion 40 of vertical tether 46 can comprise a portion of vertical tether 46 that is in physical contact with sacrificial material of sacrificial portion 12 and that extends in an at least partially vertical direction V. In embodiments of the present disclosure, at least some, but not necessarily all, of vertical portion 40 extends in an at least partially vertical direction orthogonal to source-wafer surface 11. Vertical tether 46 can extend over and above anchor portion 14. In particular, at least a part of vertical portion 40 can be disposed directly over or directly on (e.g., in physical contact with) at least a part of anchor portion 14. In some embodiments, all of vertical portion 40 is disposed directly over at least a part of anchor portion 14. In some embodiments, vertical portion 40 is not directly between component 20 and source wafer 10 and is not directly between sacrificial portion 12 and source wafer 10. Vertical portion 40 can be adjacent to component 20 and can be adjacent to sacrificial portion 12. In embodiments, at least a part of vertical portion 40 is not over sacrificial portion 12 and can be over anchor portion 14. In some embodiments, vertical portion 40 has a vertical height greater than a thickness of vertical portion 40, where the vertical portion 40 thickness can be the smallest of the three dimensions defining the volume of vertical portion 40.

In some embodiments, sacrificial portion 12 is differentially etchable from component 20 (or a bottom layer of or component bottom surface 20Z of component 20 on a side of component 20 closest or adjacent to source-wafer surface 11) and can extend horizontally beyond component 20 so that an etchant can be applied from above to sacrificial portion 12 to remove sacrificial material from sacrificial portion 12 to form a gap 12G having a sacrificial-portion thickness 12T between component 20 and source-wafer surface 11 of source wafer 10 and suspend component 20 over source-wafer surface 11 of source wafer 10 with vertical tether 46 attached to component 20 and anchor 14, for example in a micro-transfer printing process and as shown in FIG. 5B.

According to embodiments of the present disclosure, vertical tethers 46 are specifically distinguished from micro-transfer printing tethers of the prior art because vertical tethers 46 have a vertical portion 40 that at least partially extends vertically along an at least partially vertical edge or sacrificial-portion side 12E of sacrificial portion 12 from component 20 (e.g., component side 20E) to anchor portion 14 of source-wafer surface 11. In embodiments, component side 20E is at an edge of component 20 that extends in an at least partially vertical direction and is not horizontal component bottom surface 20Z or a horizontal top surface of component 20. Component bottom surface 20Z (component bottom side or component bottom) can extend substantially in a plane parallel to support-surface side 11. Component side 20E can extend for a distance that is a thickness of component 20 along a width or length of component 20 substantially parallel to source-wafer surface 11. Other tethers of the prior art can extend vertically along an anchor structure or component structure (such as a component substrate) but not along an at least partially vertical sacrificial-portion edge 12E of a sacrificial portion 12. Instead, tethers of the prior art extend along a horizontal surface of a sacrificial portion 12 that is substantially parallel to a source-wafer surface 11. By forming vertical portions 40 of vertical tethers 46, the horizontal extent of micro-transfer printable component source structure 90 (e.g., comprising component 20, sacrificial portion 12, anchor 14, and vertical tether 46) is reduced and components 20 can be formed on source wafer 10 with a greater areal density, thereby increasing the number of components 20 that can be constructed on source wafer 10 and reducing costs. Furthermore, in some embodiments, the number of process steps can be reduced. For example, in some prior art micro-transfer printing systems, a sacrificial layer must be disposed in a cavity, or an anchor structure must be built up over source-wafer surface 11, requiring additional process steps. In contrast, according to embodiments of the present disclosure, the entire vertical tether 46 can be constructed in a single series of photolithographic operations without requiring any process steps for forming an anchor. Thus, embodiments of the present disclosure can be simpler, faster, and easier to construct.

Source-wafer surface 11 can have an extensive, substantially planar area in two dimensions defining a horizontal surface H, for example a process side or process surface. A sacrificial portion 12 is disposed on source wafer 10, for example on source-wafer surface 11. Sacrificial portion 12 extends over only a portion of source-wafer surface 11 and has a sacrificial-portion side 12E extending along a sacrificial-portion edge 12E of sacrificial portion 12 in a direction at least partially orthogonal to source-wafer surface 11. Thus, sacrificial portion 12 does not completely cover source-wafer surface 11. Areas of source-wafer surface 11 that are not covered by sacrificial portion 12 can be anchor portions 14 (or anchors 14) of source-wafer surface 11 or source wafer 10. Source-wafer surface 11 can be considered a horizontal surface so that sacrificial-portion side 12E extends at least partially in a vertical direction orthogonal to the horizontal surface. (Horizontal and vertical are arbitrary designations of orthogonal dimensions or orthogonal directions.)

FIG. 1 illustrates embodiments in which vertical tether 46 extends only and exclusively over anchor portion 14. FIG. 2 illustrates embodiments of the present disclosure in which vertical tether 46 also extends over at least a portion of a top side of component 20 (e.g., extends horizontally on a side of at least a portion of component 20 opposite and substantially parallel to source-wafer surface 11) directly over sacrificial portion 12 and beyond vertical portion 40 over anchor portion 14. In such embodiments, vertical tether 46 can have a stronger attachment to component 20 and source-wafer surface 11 that can be useful if etching sacrificial material of sacrificial portion 12 creates too much stress on vertical tether 46.

FIG. 3 illustrates embodiments in which component 20 is encapsulated with an encapsulation layer 30. Encapsulation layer 30 can comprise a common or same material as vertical tether 46, for example an inorganic oxide or nitride such as silicon dioxide or silicon nitride or an organic material such as a polymer, epoxy, or photoresist, and can be deposited and patterned in common steps.

In all of FIGS. 1-3, at least a part of vertical portion 40 is in direct physical contact with sacrificial-portion side 12E, at least a part of vertical portion 40 is in direct physical contact with component side 20E, and component 20 has a component side 20E in a common plane with sacrificial-portion side 12E of sacrificial portion 12. Thus, vertical portion 40 can be adjacent to and in contact with sacrificial-portion side 12E and to component side 20E. As shown, vertical portion 40 and vertical tether 46 can extend horizontally over only a portion of sacrificial-portion side 12E or only a portion of component side 20E.

FIGS. 4A and 4B are cross sections illustrating a micro-transfer-printable component source structure 90 according to embodiments of the present disclosure corresponding to the perspective of FIG. 2. As shown in FIG. 4A, component 20 is disposed directly, entirely, and exclusively over and in physical contact with sacrificial portion 12. Sacrificial portion 12 is disposed directly and entirely over and in physical contact with source wafer 10. In some embodiments and as shown in FIGS. 4A-4B, a sacrificial-portion edge 12E of sacrificial portion 12 extends vertically from source-wafer surface 11. Similarly, a component side 20E of component 20 extends vertically from a component edge 20E of component 20 so that sacrificial-portion side 12E is substantially in a common plane with component side 20E. Vertical tether 46 extends along and in physical contact with component side 20E and sacrificial-portion side 12E to anchor portion 14 of source-wafer surface 11 of source wafer 10.

In FIGS. 4A and 4B, component 20 is shown as a horizontal inorganic LED with differently doped component layers 20A and 20B and contact pads 22 (e.g., electrodes) for making electrical contact to doped component layers 20A, 20B. Component 20 can comprise multiple layers of each of doped component layers 20A, 20B and can comprise a laser or photosensor. Contact pads 22 can be patterned electrical contacts made of a suitable electrically conductive metal. For clarity in FIGS. 4A and 4B, anchor 14 is shown as a volume in a dashed rectangle but can refer to an area that is a portion of source-wafer surface 11 of source wafer 10 above the dashed rectangle. Vertical portion 40 of vertical tether 46 is shown as the portion of vertical tether 46 in direct physical contact with sacrificial material of sacrificial portion 12 but can extend along a component side 20E of component 20, as discussed further below.

In some embodiments, an encapsulation layer 30 (that can comprise vertical tether 46) is deposited and patterned over or on (e.g., directly on or in direct physical contact with) one or more of source wafer 10 and source-wafer surface 11, for example over anchor portion 14 of source-wafer surface 11, sacrificial-portion side 12E, component side 20E, and component 20 to form vertical tether 46, for example as shown in FIG. 3. Vertical tether 46 can extend over a top surface of component 20 and over source-wafer surface 11 beyond the area of source-wafer surface 11 covered by vertical portion 40, as shown in FIG. 2. Where vertical tether 46 is disposed on component 20, vertical tether 46 can extend over and on component 20 at least partially in a horizontal parallel to source-wafer surface 11 and can at least partially encapsulate or electrically insulate component 20. Vertical tether 46 disposed over component 20 can encapsulate or cover some or all of component 20, for example some of component side 20E. Where vertical tether 46 is disposed on component side 20E (e.g., component edge 20E), vertical tether 46 can extend over and on component side 20E in an at least partially vertical direction at least partially orthogonal to source-wafer surface 11 and can at least partially encapsulate or electrically insulate one or more component side(s) 20E of component 20.

Where vertical tether 46 is disposed on sacrificial-portion side 12E (e.g., sacrificial-portion edge 12E), vertical tether 46 can extend over and on sacrificial-portion side 12E in a vertical direction at least partially orthogonal to source-wafer surface 11 and can be at least partially differentially etchable with respect to sacrificial portion 12. Where vertical tether 46 is disposed on sacrificial-portion side 12E it can form vertical portion 40 and can be patterned to have a width that is less than a width of component side 20E or a portion of vertical tether 46 disposed on component side 20E.

Where vertical tether 46 is disposed on anchor portion 14 (e.g., anchor 14), vertical tether 46 can extend over and on source-wafer surface 11 in an at least partially horizontal direction at least partially parallel to source-wafer surface 11 and can be at least partially differentially etchable with respect to sacrificial portion 12.

Vertical tether 46 can be an inorganic dielectric material such as silicon dioxide or silicon nitride or an organic material such as polyimide, resin, epoxy, a cured adhesive, or a photoresist, or layers of such materials. Vertical tether 46 material can be deposited (e.g., by) and patterned using photolithographic techniques to pattern vertical portion 40 and any other portion of vertical tether 46, for example using material evaporation or sputtering followed by patterning with a masked photoresist and pattern-wise etching.

FIG. 4A illustrates a micro-transfer-printable component source structure 90 with sacrificial portion 12 comprising a sacrificial material that is differentially etchable from a component material comprising component 20, differentially etchable from a tether material comprising vertical tether 46, differentially etchable from a source-wafer material comprising source wafer 10, and differentially etchable from an anchor material comprising anchor 14. In some embodiments, source wafer 10 can comprise a same material as component 20, for example a semiconductor material. FIG. 4A illustrates embodiments in which sacrificial portion 12 comprises a sacrificial material; FIG. 4B illustrates an embodiment of micro-transfer-printable component source structure 90 in which sacrificial material of sacrificial portion 12 is removed, e.g., by etching, to suspend component 20 over source wafer 10 with vertical tether 46 physically connecting anchor 14 to component side 20E and forming a gap 12G between component 20 and source wafer 10. As intended herein, sacrificial portion 12 can comprise sacrificial material, for example as shown in FIG. 4A or can comprise or form gap 12G, as shown in FIG. 4B.

In FIGS. 4A and 4B, vertical portion 40 is shown as extending from source-wafer surface 11 and only along sacrificial-portion side 12E in a vertical direction. FIG. 5A illustrates this structure in more detail. In some embodiments and as shown in FIG. 5B, vertical portion 40 extends only along a portion of sacrificial-portion side 12E in a vertical direction above a portion of vertical tether 46 in contact with source-wafer surface 11 and below component 20 so that vertical portion 40 comprises that portion of vertical tether 46 that is not in contact with either component 20 or source wafer 10. FIG. 5C illustrates embodiments in which vertical portion 40 extends from source-wafer surface 11 along at least a portion of sacrificial-portion side 12E and along at least a portion of component side 20E (e.g., to a top of component 20) in a vertical direction.

In general, and as shown in FIG. 6, when micro-transfer printing component 20 from source wafer 10, vertical portion 40 of vertical tether 46 fractures along a fracture line 42. Fracture line 42 can take any shape but is illustrated as a straight line and can extend horizontally parallel to or on a diagonal (e.g., at least partly in vertical direction V) with respect to source-wafer surface 11, as shown with the multiple dashed lines in FIG. 6. Fracture line 42 can be completely within vertical portion 40 or can extend from a location of vertical portion 40 to another portion of vertical tether 46. Although multiple fracture lines 42 are shown with dashed lines in FIG. 6, in actual practice only one fracture line 42 is typically formed when removing component 20 from source wafer 10 with a stamp 60 (e.g., as shown in FIGS. 16G-16J discussed below) after etching sacrificial material in sacrificial portion 12. Most often, fracture lines 42 will extend from (e.g., begin or end at) some part of vertical portion 40 as shown in FIG. 5B where vertical tether 46 is disposed along sacrificial-portion side 12E and is not along either source wafer 10 or component 20.

FIGS. 1-6 illustrate embodiments in which component side 20E is in a common plane with vertical portion 40 of vertical tether 46. In some embodiments and as shown in FIGS. 7A and 7B, component side 20E is not in a common plane with vertical portion 40 of vertical tether 46. As shown in FIG. 7, component 20 is horizontally offset from sacrificial-portion side 12E (an at least partly vertical sacrificial-portion edge 12E of sacrificial portion 12). Such embodiments can be easier to construct, depending on the process and materials used and does not require edge alignment between component 20 and sacrificial portion 12. In such embodiments, vertical tether 46 can extend over a surface of sacrificial portion 12, for example a substantially horizontal top surface, to component side 20E. The horizontal portion of vertical tether 46 that extends over a horizontal surface of sacrificial portion 12 can contact component side 20E, as shown in FIG. 7A. FIG. 7B illustrates embodiments in which vertical tether 46 extends up along (in a vertical direction V away from source-wafer surface 11) component side 20E to a top surface of component 20. Vertical tether 46 can extend over the top surface of component 20, for example as shown in FIG. 7C. (In general, a top surface of a layer or structure is on an opposite side of a bottom surface with respect to source-wafer surface 11. The bottom surface can be adjacent to source-wafer surface 11.)

FIGS. 8A and 8B are cross sections of micro-transfer-printable component source structure 90 with components 20 offset from sacrificial-portion side 12E corresponding to the perspective of FIG. 7C and comparable to non-offset FIGS. 4A and 4B. In FIG. 8A, component 20 is shown as a horizontal integrated circuit (for example a CMOS IC with a circuit, not shown) with contact pads 22 for making electrical contact to component 20. For clarity in FIGS. 8A and 8B, anchor 14 is shown as a volume in a dashed rectangle but can refer to an area of source-wafer surface 11 of source wafer 10 above the dashed rectangle. Vertical portion 40 of vertical tether 46 is shown as the portion of vertical tether 46 in direct physical contact with sacrificial material of sacrificial portion 12 but can extend along a component side 20E of component 20. Component side 20E and sacrificial-portion side 12E are offset, are not in a common plane, and are not parallel. Vertical tether 46 extends over a top surface of component 20 and over source-wafer surface 11 beyond the area of source-wafer surface 11 covered by vertical portion 40 and physically connects component 20 to source-wafer surface 11 along an at least partially vertical sacrificial-portion side 12E of sacrificial portion 12. FIG. 8A illustrates embodiments in which sacrificial portion 12 comprises a sacrificial material; FIG. 8B illustrates an embodiment of micro-transfer-printable component source structure 90 in which sacrificial material of sacrificial portion 12 is removed, e.g., by etching, to suspend component 20 over source wafer 10 with vertical tether 46. As intended herein, sacrificial portion 12 can comprise sacrificial material, for example as shown in FIG. 8A or can comprise or form a gap 12G, as shown in FIG. 8B.

In FIGS. 8A and 8B, vertical portion 40 is shown as extending from source-wafer surface 11 and only along sacrificial-portion side 12E in a vertical direction. FIG. 9A illustrates this structure in more detail. In some embodiments and as shown in FIG. 9B, vertical portion 40 extends along a portion of sacrificial-portion side 12E in a vertical direction above a portion of vertical tether 46 in contact with source-wafer surface 11. FIG. 9C illustrates embodiments in which vertical portion 40 extends from source-wafer surface 11 along a portion of sacrificial-portion side 12E and above sacrificial portion 12 to at least a portion of component side 20E in a vertical direction away from source-wafer surface 11.

In general, and as shown in FIG. 10, when micro-transfer printing component 20 from source wafer 10, vertical portion 40 of vertical tether 46 fractures along a fracture line 42. Fracture line 42 can take any shape but is illustrated as a straight line and can extend horizontally parallel to or on a diagonal (e.g., at least partly in vertical direction V) with respect to source-wafer surface 11, as shown with the multiple dashed lines in FIG. 10. Fracture line 42 can be completely within vertical portion 40 or can extend from a location of vertical portion 40 to another portion of vertical tether 46. Although multiple fracture lines 42 are shown with dashed lines in FIG. 10, in actual practice only one fracture line 42 is typically formed when removing component 20 from source wafer 10 with a stamp 60 after etching sacrificial material in sacrificial portion 12. Most often and in some embodiments, fracture lines 42 extend from (e.g., begin or end at) some part of vertical portion 40 (as shown in FIG. 9B) that is disposed along sacrificial-portion side 12E and not along component side 20E or along source-wafer surface 11.

FIGS. 1-10 illustrate sacrificial portions 12 with vertical edges (e.g., sacrificial-portion side 12E are substantially vertical). In some embodiments, either or both of component side 20E and sacrificial-portion side 12E are not substantially vertical with respect to source-wafer surface 11 but instead extend in a direction that is greater than zero but less than 90 degrees (e.g., an angled edge or angled side) with respect to source-wafer surface 11, for example 20, 30, 45, 50, 60, 70, or 80 degrees, as shown in FIGS. 11A and 11B. Component side 20E and sacrificial-portion side 12E can have different angles or the same angle with respect to source-wafer surface 11. If the angles are the same, component side 20E and sacrificial-portion side 12E can be in different but substantially parallel planes. In some embodiments, component side 20E and sacrificial-portion side 12E are in different non-parallel planes (as in FIGS. 8A and 8B).

FIGS. 11A and 11B illustrate embodiments in which component side 20E and sacrificial-portion side 12E are angled and in a common plane, but in some embodiments component 20 is offset from sacrificial-portion side 12E, as shown in FIGS. 12A and 12B. In some embodiments, component edge 20E extends at an angle no less than 45 degrees from source-wafer surface 11 or component edge 20E extends orthogonally from source-wafer surface 11. Similarly, sacrificial-portion edge 12E can extend at an angle no less than 45 degrees from source-wafer surface 11 or sacrificial portion edge 12E extends orthogonally from source-wafer surface 11. Component side 20E and sacrificial-portion side 12E can have different angles or a same angle. If the angles are the same, component side 20E and sacrificial-portion side 12E can be in different but substantially parallel planes.

FIGS. 11A and 12A illustrate embodiments in which sacrificial portion 12 comprises a sacrificial material; FIGS. 11B and 12B illustrate embodiments of micro-transfer-printable component source structure 90 in which sacrificial material of sacrificial portion 12 is removed, e.g., by etching, to suspend component 20 over source wafer 10 with vertical tether 46. As intended herein, sacrificial portion 12 can comprise sacrificial material, for example as shown in FIGS. 11A and 12A or can comprise or form a gap 12G, as shown in FIGS. 11B and 12B.

As indicated in FIGS. 6 and 10, and as is also true for FIGS. 11B and 12B, fracture lines 42 can form in a variety of locations in vertical tether 46. In some embodiments, fracture lines 42 extend from (e.g., begin or end at) vertical portion 40 or extend entirely through vertical portions 40. In some embodiments, fracture lines 42 can form below a component bottom surface 20Z of component 20, forming a vertical tether standoff, e.g., a vertical tether standoff that extends at least partially orthogonally to source-wafer surface 11 to component 20. The vertical tether standoff can be vertical portion 40 or a part of vertical portion 40. When such a component 20 is micro-transfer printed to a target substrate 50 (e.g., as shown in FIG. 16I discussed below), the vertical tether standoff can inhibit close alignment between a surface of a target substrate 50 and a component bottom surface 20Z of component 20, reducing adhesion between the surfaces. If an adhesive layer 52 that is thicker than the height of the vertical tether standoff is present on the target substrate 50 (e.g., as shown in FIG. 17 discussed below), the presence of the vertical tether standoff is not likely to inhibit adhesion between component 20 and target substrate 50. However, if adhesive layer 52 is thinner than the height of the vertical tether standoff or if no adhesive layer 52 is present, the vertical tether standoff can prevent adequate adhesion between component 20 and target substrate 50.

FIGS. 13A and 13B illustrate embodiments of the present disclosure in which any vertical tether standoff is unlikely to extend beyond a component bottom surface 20Z of component 20. Sacrificial portion 12 can be constructed with a stepped edge 12S extending vertically up and away from source-wafer surface 11 a height of P along sacrificial-portion side 12E above the remaining part of sacrificial portion 12, for example using photolithographic masking and etching. Component 20 can be constructed using epitaxial deposition and subsequent photolithographic materials deposition, doping, and patterning methods to a depth greater than height P of stepped edge 12S. When removing component 20 from source wafer 10 using a stamp 60 and micro-transfer printing, vertical portion 40 can fracture so that any vertical tether standoff extends less than a distance P from a component bottom surface 20Z of component 20, as indicated with fracture lines 42 in FIG. 13B. Thus, any vertical tether standoff will not inhibit micro-transfer print component 20 to a target substrate 50. FIG. 13A illustrates a micro-transfer-printable component source structure 90 with a sacrificial portion 12 stepped edge 12S with a sacrificial material. FIG. 13B illustrates a micro-transfer-printable component source structure 90 with a sacrificial portion 12 stepped edge 12S and gap 12G after etching the sacrificial material.

In embodiments, vertical portion 40 does not cover all of sacrificial-portion edge 12E or component edge 20E. Vertical tether 46 can have a sacrificial portion width on at least a portion of sacrificial-portion side 12E that is narrower than a component width (e.g., in a horizontal direction H) and on at least a portion of component side 20E. (In some embodiments, vertical tether 46 can be an encapsulation layer 30 for component side 20E, as shown in FIG. 3.) In some embodiments of the present disclosure and as illustrated in the end view of FIG. 14, vertical portion 40 of vertical tether 46 can have a neck 44 or a part of vertical portion 40 that is narrower in a horizontal direction than other parts of vertical portion 40. Thus, in embodiments, vertical tether 46 can have a first width on at least a portion of sacrificial-portion side 12E that is narrower than a second width on at least a portion of sacrificial-portion side 12E. The narrower part (neck 44) can preferentially fracture when vertical tether 46 is stressed, for example by removing component 20 from source wafer 10 by micro-transfer printing with a stamp 60. Thus, the location of a fracture (e.g., fracture line 42) in vertical portion 40 can be controlled, for example to control any vertical tether standoff.

As shown in FIGS. 15A and 15B, in some embodiments of the present disclosure component 20 is a vertical component 20 with a vertical height extending over source-wafer surface 11 a distance greater than a horizontal width or length over source-wafer surface 11. In some such embodiments, the use of vertical tether 46 is particularly useful since the horizontal extent of micro-transfer printable component 20 with a vertical tether 46 and anchor 14 is limited, enabling a dense disposition of components 20 on source wafer 10, reducing costs. As shown in FIG. 15A (with sacrificial material) and 15B (with gap 12G), a component 20 such as a vertical-cavity surface-emission laser (VC-SEL), can comprise a bottom contact pad 22 for making an electrical connection on component bottom surface 20Z (bottom side) of component 20 and a top contact pad 22 for making an electrical connection on the top side of component 20.

Figures 16A, 16B, 16C:
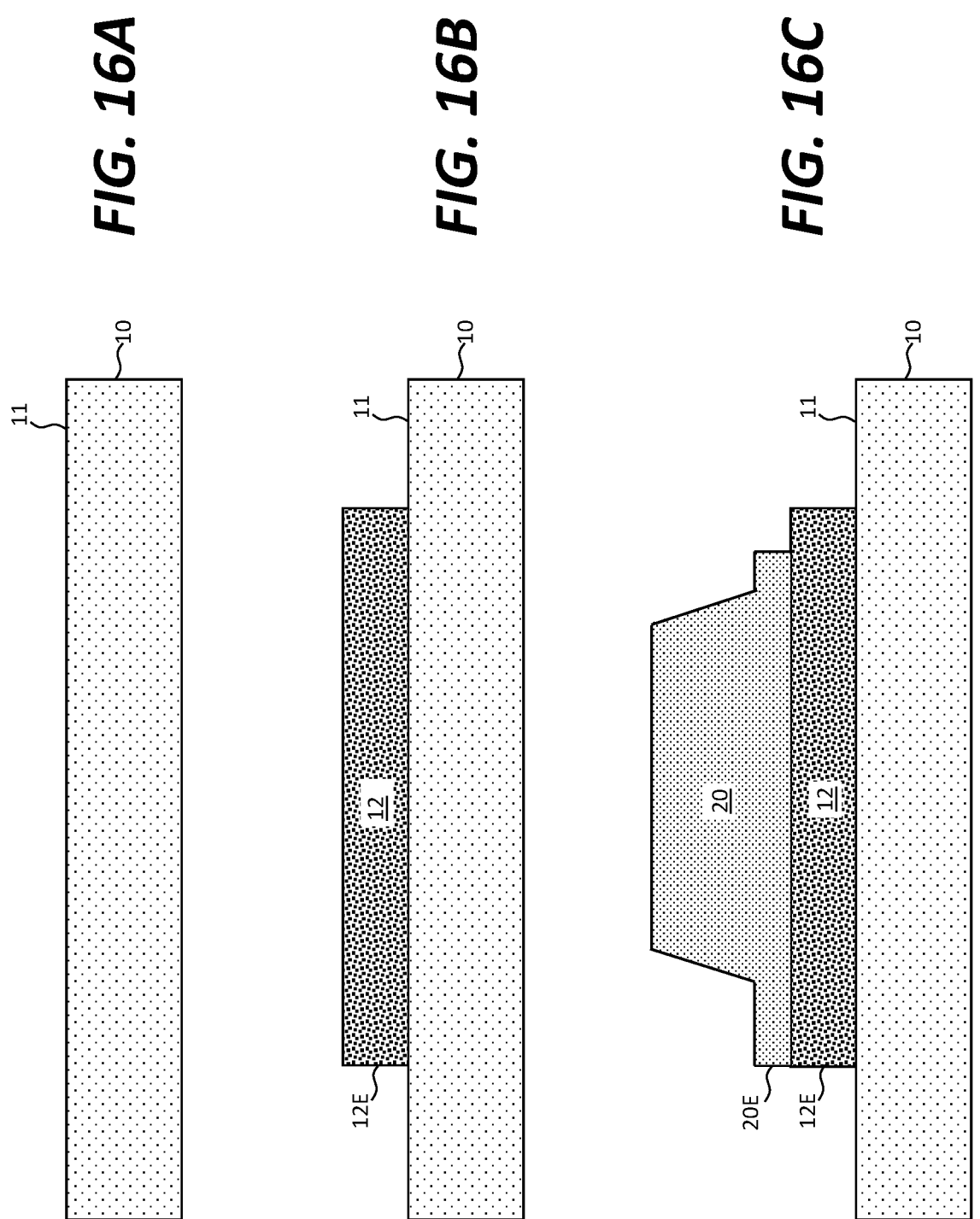

FIGS. 16A-16K and 18 illustrate successive structures or methods of the present disclosure for making micro-transfer-printable component source structure 90 and micro-transfer printing component 20 from micro-transfer printable component source structure 90 to a target substrate 50. As shown in FIG. 16A, in step 100 of FIG. 18 a source wafer 10 (a source substrate 10) is provided with a source-wafer surface 11 (e.g., a process surface). Such source wafers 10 can be found in the integrated circuit or display industries and can be, for example, a semiconductor wafer such as a silicon or compound semiconductor wafer, a sapphire wafer, a quartz wafer, a ceramic wafer, or a glass wafer. The process side (e.g., source-wafer surface 11) is a side of source wafer 10 on which materials (e.g., electric insulators and conductors) can be deposited and photolithographically processed (e.g., patterned using masked exposures of photoresists coated over the materials and etching)

In step 105 and as shown in FIG. 16B, a sacrificial portion 12 is formed on source wafer 10, for example by evaporating, vapor depositing, or sputtering an unpatterned layer of sacrificial material on source wafer 10, depositing either a positive or negative photoresist on the unpatterned layer of sacrificial material, exposing the photoresist through a mask to define the area of the sacrificial material, washing the photoresist, etching the sacrificial material through the mask to define sacrificial portion 12, and stripping the remaining photoresist. Such a process is a conventional photolithographic process. Sacrificial portion 12 can have a sacrificial-portion side 12E extending in a substantially vertical (or at least partly vertical) direction V from source wafer 10. Sacrificial material can be any material that is differentially etchable from component 20 and vertical tether 46 and can be differentially etchable from source wafer 10.

Figure 16D:
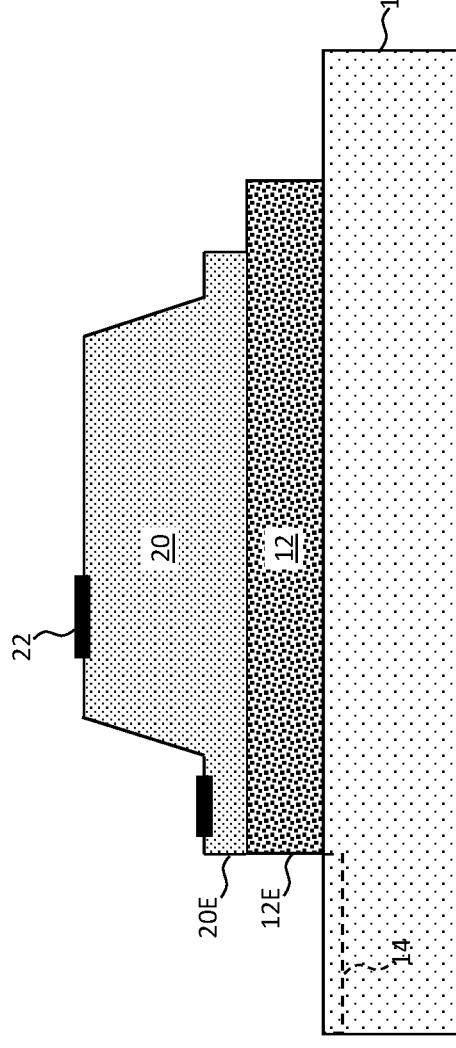

Component 20 is constructed in step 110 as shown in FIG. 16C, for example using photolithographic processes to deposit, dope, and pattern one or more epitaxial layers of a semiconductor such as silicon or a compound semiconductor, to form any electrically or optically active structures (e.g., transistors, light emitting diodes, sensors, lasers, photodiodes, and the like), electrical connections, electrical circuits, optical structures, electro-optical structures, or contact pads 22 electrically connected to the structures or circuits. Component 20 can have a component side 20E extending in a vertical (or at least partly vertical) direction V from source wafer 10. As shown in FIG. 16D, any other structures useful for component 20, for example contact pads 22, can be formed in step 115, for example using photolithographic methods and materials.

Figure 16E:
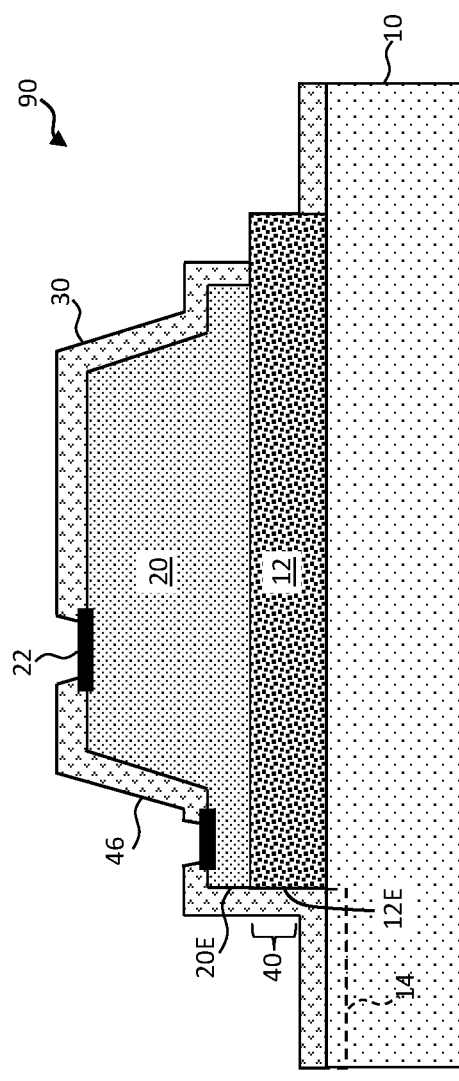

As shown in FIG. 16E, a tether material, for example an inorganic encapsulation material such as silicon dioxide or silicon nitride or an organic material such as a polymer or photoresist, or multiple layers of such, can be deposited over component 20 and on at least an anchor portion 14 of source-wafer surface 11 in step 120. The tether material can also form an encapsulation layer 30 (e.g., a protection layer) over component 20. The tether material can be patterned in step 125, for example using photolithographic methods and materials, to form vertical tether 46, vertical portion 40 with or without neck 44, and any desired portion of encapsulation layer 30. Encapsulation layer 30 can provide environment and electrical insulation to component 20. Materials for all or any of vertical tether 46, vertical portion 40, and any encapsulation layer 30 can be deposited in a common step and patterned in a common step.

Figure 16F:
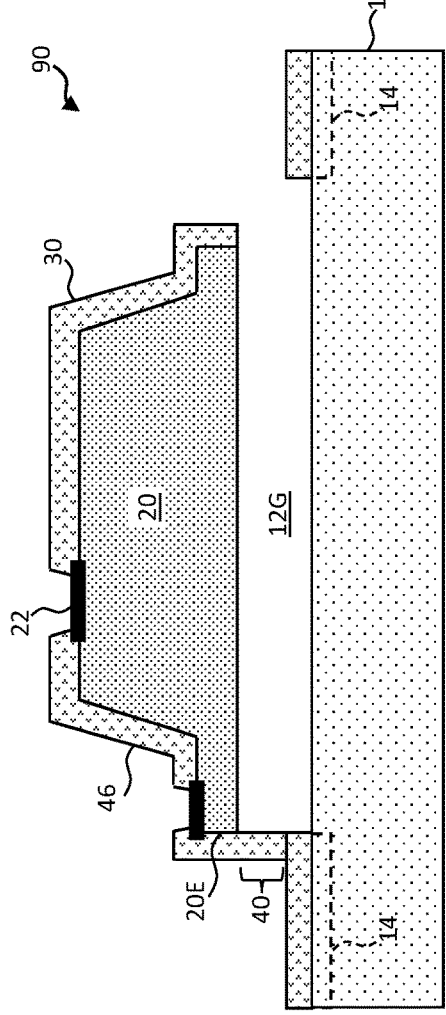

Once micro-transfer-printable component source structure 90 is formed as shown in FIG. 16E, sacrificial material of sacrificial portion 12 can be etched and removed to form gap 12G in step 130, as shown in FIG. 16F.

Figure 16G:
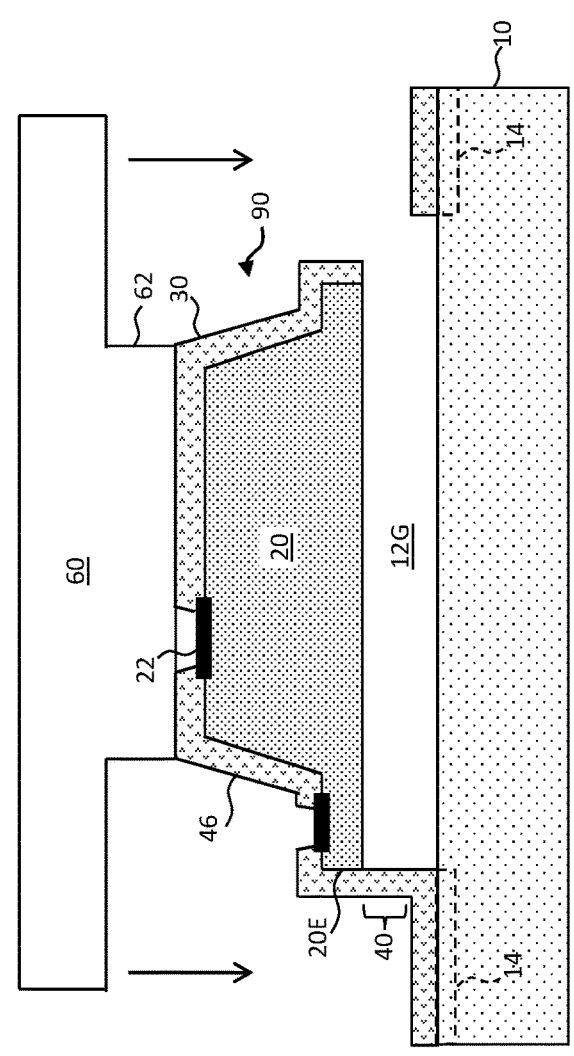
Figure 16H:
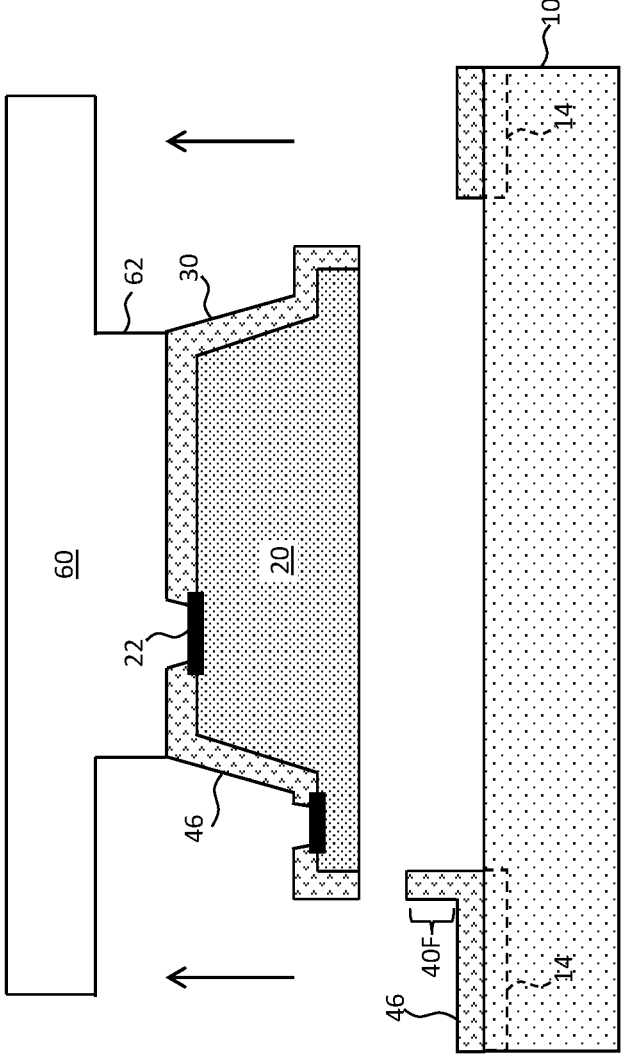
Figures 16I, 16J:
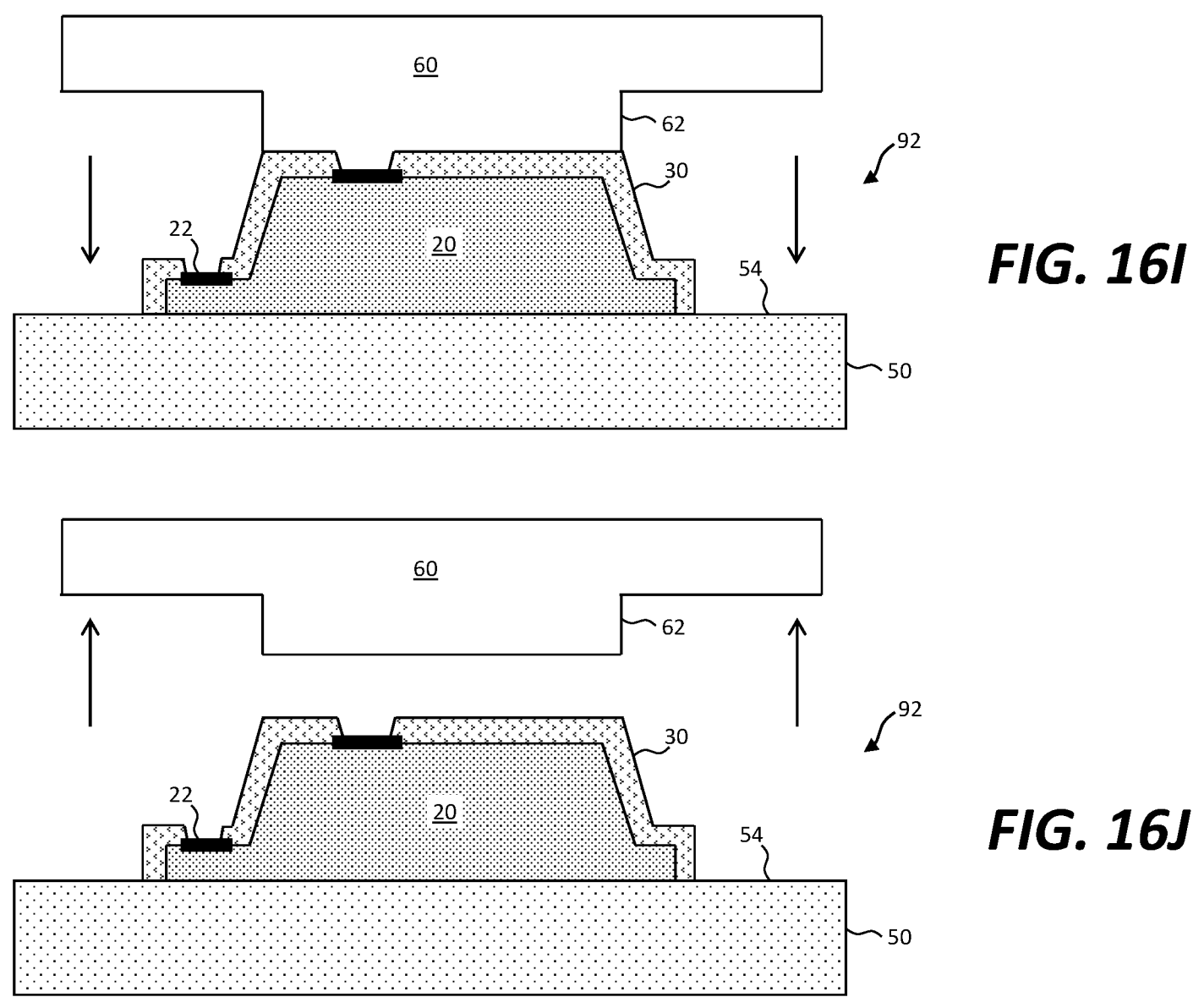

Component 20 can then be micro-transfer printed with a stamp 60 as shown in FIG. 16G by pressing stamp 60 with stamp post 62 against component 20 (e.g., a top side of component 20) to adhere component 20 to stamp post 62 in step 135. As shown in FIG. 16H, stamp 60 and adhered component 20 are removed in step 140, thereby fracturing vertical portion 40 of vertical tether 46, for example at a fracture line 42 (not shown in FIG. 16H) to form fractured vertical tether 40F. Usually, fracture line 42 is formed in at least a portion of vertical portion 40 to form fractured vertical tether 40F.

Figure 16K:
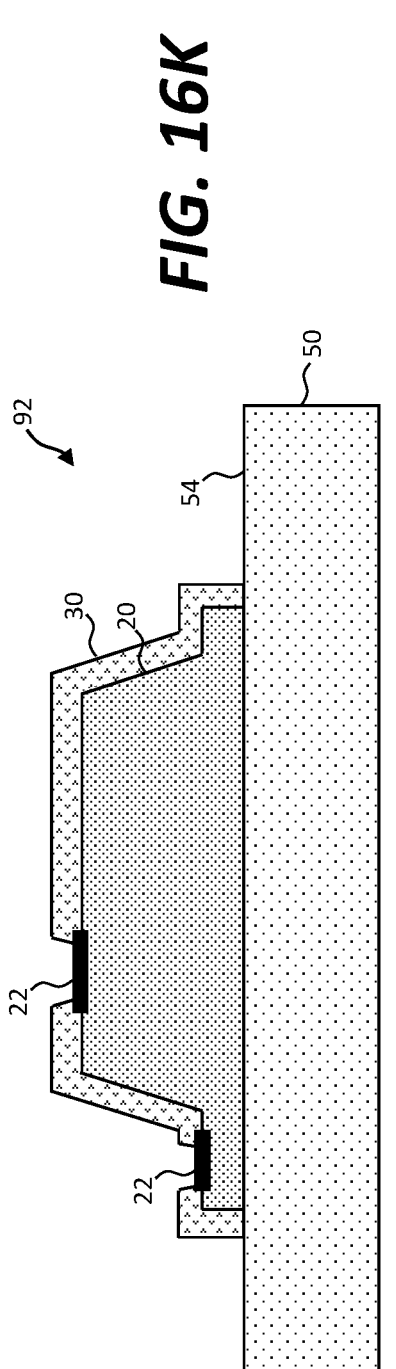

Stamp 60 with component 20 is then moved, for example by a motion-and-optics mechanical stage, to target substrate 50 in step 145 and pressed against a target-substrate surface 54 of target substrate 50 in step 150, as shown in FIG. 16I. Target substrate 50 can be, for example, a semiconductor substrate such as silicon, glass, ceramic, or plastic. Stamp 60 is then removed from component 20 in step 155 as shown in FIG. 16J, leaving component 20 adhered to target substrate 50, as shown in FIG. 16K. Steps 130-155 comprise a combined step 160 to micro-transfer print component 20 from source wafer 10 to target substrate 50 and construct a micro-transfer-printed component target structure 92.

As shown in FIG. 17, target-substrate surface 54 of target substrate 50 can be coated (e.g., by spin or spray coating) with an adhesive layer 52 before pressing component 20 against target-substrate surface 54 in step 150. Adhesive layer 52 can facilitate adhesion between component 20 and target-substrate surface 54.

In some embodiments of the present disclosure, micro-transfer-printable component source structures 90 can comprise multiple vertical tethers 46 as shown in FIG. 19A with sacrificial material in sacrificial portion 12, in FIG. 19B with a gap 12G for sacrificial portion 12, and in the plan view of FIG. 20. As shown in FIG. 20, micro-transfer-printable component source structure 90 comprises four vertical tethers 46, one on each side of rectangular component 20. In general, and according to embodiments of the present disclosure, micro-transfer-printable component source structures 90 can comprise any number of vertical tethers 46.

In some embodiments and as shown in FIG. 21, vertical portions 40 of vertical tethers 46 are intentionally designed to form vertical tether standoffs by locating a neck 44 at the bottom of vertical portion 40 forming a fracture line 42 closer to source wafer 10 than to component 20. When fractured, vertical tether 46 can form a vertical tether standoff that extends from component 20 at least partly orthogonally to component bottom surface 20Z. As shown in FIGS. 22 and 23, when components 20 are micro-transfer printed to a target substrate 50, the vertical tether standoffs can desirably prevent component bottom surface 20Z from directly contacting target-substrate surface 54, providing a way to adjust and control a height of component 20 over target substrate 50. Furthermore, because the vertical tether standoffs extend primarily or substantially vertically rather than horizontally, component 20 can be located closer to other structures disposed on target substrate 50. Thus, in some embodiments, a micro-transfer-printed component target structure 92 comprises a target substrate 50 having a target-substrate surface 54, a component 20 disposed on target substrate 50, component 20 having a component side 20E extending along a component edge 20E of component 20 in a direction at least partially orthogonal to target-substrate surface 54, and a vertical tether standoff extending from component 20 to target-substrate surface 54 and comprising a vertical portion 40 that extends in a direction at least partially orthogonal to target-substrate surface 54 that prevents a component bottom surface 20Z of component 20 from contacting target-substrate surface 54 in a micro-transfer-printed component target structure 92.

According to some embodiments, the vertical tether standoff has a fractured or separated end in contact with target-substrate surface 54 or a layer disposed on target-substrate surface 54. The fractured or separated vertical tether standoff can be fractured or separated as a consequence of micro-transfer printing the vertical tether standoff from source wafer 10 to target substrate 50, e.g., as shown in FIG. 26, discussed below.

As shown in FIG. 22 and according to some embodiments of the present disclosure, a mechanical structure 56 can be disposed on or in target substrate 50. Mechanical structure 56 can be, for example, an organic material (e.g., an epoxy, resin, polyimide, or photoresist) or an inorganic material (e.g., a silicon oxide or silicon nitride) structure constructed, for example by photolithographic methods. Mechanical structure 56 can have a mechanical-structure side 56E that extends in a direction at least partly orthogonal to target-substrate surface 54 in a vertical direction V. In some embodiments, the vertical tether standoff can be in contact with or at least within one micron (e.g., within 500 nm, 200 nm, or 100 nm) of mechanical-structure side 56E or an adhesive layer 52 disposed on at least a portion of mechanical structure 56. (For clarity, FIGS. 22 and 23 do not illustrate an adhesive layer 52, for example as shown in FIG. 17, but such an adhesive layer 52 can be disposed on target substrate 50 and can contact the vertical tether standoffs, component 20, component sides 20E, or mechanical-structure side 56.)

In some embodiments and as shown in FIG. 23, micro-transfer-printed component target structures 92 of the present disclosure can be or comprise photonic structures. Mechanical structure 56 can comprise a first optical structure, component 20 can comprise a second optical structure, and the first optical structure can be in alignment with the second optical structure, for example to transmit or receive light 72. In some embodiments, first optical structure is a light pipe 70 and second optical structure is a light emitter, light controller, or light sensor as shown in FIG. 23. In other embodiments, second optical structure is a light pipe 70 and first optical structure is a light emitter, light controller, or light sensor. First and second optical structures can also comprise passive optical structures such as optical reflectors, refractors, or diffractors. A light emitter, light controller, or light sensor can be a laser, a light-emitting diode, a photodiode, an optical amplifier, or an optical modulator.

As shown in FIGS. 22 and 23, mechanical structure 56 extends away from target substrate 50 and target-substrate surface 54 in a direction at least partly orthogonal to target-substrate surface 54 in a vertical direction V. In other embodiments, and as shown in FIG. 24, target substrate 50 can comprise a cavity 58 extending into target substrate 50 and component 20 with attached vertical tether standoffs can be disposed in cavity 58. Cavity 58 can have cavity walls around a perimeter of cavity 58 that serve as mechanical-structure sides 56E of a mechanical structure 56 and target substrate 50 can include light pipes 70, for example with patterned silicon nitride layers formed in target substrate 50 using photolithographic methods and materials.

FIGS. 1-7 and 19A-24 illustrate vertical portions 40 of vertical tethers 46 that are adjacent to, and in some cases in contact with, component side 20E but not in contact with component bottom surface 20Z. Thus, vertical portions 40 are not directly between component 20 and source wafer 10 or target substrate 50 in a vertical direction V orthogonal to source-wafer surface 11 or target-substrate surface 54. In some other embodiments of the present disclosure and as illustrated in FIGS. 25A-25D, vertical portions 40 are disposed directly between component 20 and source wafer 10 or target substrate 50 so that vertical portions 40 are directly under component bottom surface 20Z of component 20. By disposing vertical portions 40 (e.g., at least a portion or all of vertical tether 46) directly between component 20 and target substrate 50, the horizontal extent of micro-transfer-printed component target structure 92 is reduced and component side 20E can come into direct contact with mechanical-structure side 56E, for example as shown in FIG. 26, thereby reducing the structure size and, for photonic devices, reducing the materials through which light 72 passes (e.g., light 72 does not need to pass through vertical tether 46 as can be seen by comparing FIG. 26 with no vertical tether 46 between component side 20E and mechanical-structure side 56E to FIG. 23 with encapsulating layer 30 disposed between component side 20E and mechanical-structure side 56E. FIG. 26 includes a side view detail (corresponding to the cross section) showing a thickness of vertical tether 46 and an end view detail showing a fractured vertical portion 40 of a vertical tether 46 showing a horizontal width of vertical tether 46 with a neck 44 disposed adjacent to, on, or in contact with target substrate 50.

FIG. 25A shows component 20 disposed over sacrificial portion 12 with component side 20E aligned to sacrificial-portion side 12E on source wafer 10. Vertical portion 40 of vertical tether 46 (that also services as a vertical standoff) is disposed between component bottom surface 20Z of component 20 and source wafer 10 in alignment with component edge 20E. FIG. 25B is a plan view illustrating four vertical portions 40 of four vertical tethers 46 illustrated with dashed lines (forming vertical standoffs when micro-transfer printed to a target substrate 50) in alignment with the four corresponding component sides 20E of rectangular component 20 and disposed beneath component 20. Sacrificial portion 12 can extend beyond component sides 20E (as shown on three component sides 20E of component 20) or can be aligned with component sides 20E (as shown on the left component side 20E of component 20). In some embodiments, sacrificial portion 12 extends beyond component 20 in a horizontal direction on every side of component 20. Anchor portion 14 can include the area under vertical portions 40 on source-wafer surface 11, even if surrounded by sacrificial portion 12. FIGS. 25C and 25D illustrate a vertical portion 40 detail before (FIG. 25C) and after (FIG. 25D) etching sacrificial material of sacrificial portion 12 to form gap 12G. By disposing vertical portions 40 directly beneath component 20 and in alignment with component side 20E around a perimeter of component 20, component 20 of micro-transfer-printed target structure 92 is disposed more stably on target substrate 50 in a micro-transfer-printed component target structure 92 and is less likely to mechanically rock, tip, tilt, or otherwise have a less desirable component bottom surface 20Z orientation with respect to target-substrate surface 54, for example component bottom surface 20Z is more likely to be substantially parallel to target-substrate surface 54 because vertical portions 40 are distributed around a perimeter of component 20, are more widely separated from each other, and are not close to a center of component 20.

Structures such as those of FIGS. 25A-25D can be constructed by patterning vertical portions 40 and sacrificial portion 12, for example using photolithographic methods and materials. Epitaxial material can be disposed over at least a part (or all) of vertical portions 40 and at least some of sacrificial portion 12 and then processed to form component 20 (e.g., as in step 110 of FIG. 18). A completed component 20 can be micro-transfer printed to target substrate 50 from source wafer 10, for example as further described with respect to FIG. 18 in step 160.

Thus, according to embodiments of the present disclosure, a method of making a micro-transfer-printable target structure 92 can comprise providing a target substrate 50 having a target-substrate surface 54, providing a component 20 reversibly adhered to a stamp 60 (e.g., reversibly adhered to stamp post 62 of stamp 60), component 20 having a component side 20E extending along a component edge 20E of component 20 in a direction at least partially orthogonal to target-substrate surface 54, providing a vertical tether standoff extending from component 20 to target-substrate surface 54 and comprising a vertical portion 40 in a direction at least partially orthogonal to target-substrate surface 54 in a vertical direction V, contacting the vertical tether standoff to target substrate 50 or to a layer disposed on target substrate 50 with stamp 60 to adhere the vertical tether standoff to target-substrate surface 54, and removing stamp 60, leaving the vertical tether standoff adhered to target substrate 50 and component 20, for example to component bottom surface 20Z. The layer can be an adhesive layer 52, and the vertical tether standoff can be adhered to target substrate 50 with adhesive layer 52.

According to some methods of the present disclosure and as illustrated in FIGS. 27A and 27B, components 20 can be aligned with and located close to or in contact with mechanical structures 56 when micro-transfer printing components 20 to target substrates 50 by moving components 20 with stamp 60 in both horizontal and vertical directions in step 150. As shown in FIG. 27A, after components 20 are moved to target substrate 50 in step 145 (shown in FIG. 18), stamp 60 can press components 20 against target-substrate surface 54 (or an adhesive layer 52 on target-substrate surface 54) in a vertical direction in step 200 and then move component side 20E of component 20 against mechanical-structure side 56E by moving component 20 in a horizontal direction toward mechanical structure 56 in step 205, thus contacting component 20 against mechanical structure 56, or at least bringing component 20 in close proximity (e.g., within one micron, 500 nm, 200 nm, or 100 nm) to mechanical structure 56. Stamp 60 is then removed in step 155.

Alternatively, and as illustrated in embodiments corresponding to FIG. 27B, after components 20 are moved to target substrate 50 in step 145 (shown in FIG. 18), stamp 60 can press a component side 20E of components 20 against mechanical-structure side 56E by moving component 20 in a horizontal direction toward mechanical structure 56 in step 210, thus contacting component 20 against mechanical structure 56, or at least bringing component 20 in close proximity (e.g., within one micron, 500 nm, 200 nm, or 100 nm) to mechanical structure 56 before contacting vertical portions 40 to target-substrate surface 54 (or an adhesive layer 52 on target-substrate surface 54). Stamp 60 can then press components 20 against target-substrate surface 54 in a vertical direction in step 215 and stamp 60 is subsequently removed in step 155.

In some embodiments, stamp 60 moves component 20 in both vertical and horizontal directions at a same time to contact component 20 to mechanical structure 56 and to contact vertical portions 40 to target substrate 50 (or an adhesive layer 52). In any of these cases, vertical portions 40 can provide vertical alignment to component 20 with respect to mechanical structure 56. This alignment can be more stable than simply micro-transfer printing component 20 to adhesive layer 52, since curing adhesive layer 52 can cause adhesive layer 52 to shrink or otherwise move component 20 with respect to mechanical structure 56. Adhesive layer 52 can be cured after component 20 are micro-transfer printed to target substrate 50.

A micro-transfer-printable component source structure 90 and a micro-transfer-printed component target structure 92 according to embodiments of the present disclosure has been constructed, micro-transfer printed, and successfully operated. Source wafer 10 can be a GaAs source wafer 10 and sacrificial portion 12 can be a patterned layer of AlGaAs approximately 500 nm thick (e.g., in a range from 200 nm to 2000 nm) etchable with hydrochloric acid (HCl). One or more epitaxial layers of GaAs are formed over sacrificial portion 12 that maintains the crystalline structure of the underlying GaAs source wafer 10. The various epitaxial layers can be doped to form top and bottom electrodes having a thickness of one to five microns (e.g., two microns), for example as shown in FIG. 15A, together with one or more doped epitaxial layers (e.g., as shown in FIGS. 4A-4B and 15A-15B to form light-emitting, light-absorbing, light-modulating, light-amplifying, or light-reflecting structures)

to form component 20 having a vertical component height 20T (component thickness 20T) of five to fifteen microns (e.g., ten microns). Component 20 can be, for example, a vertical-cavity surface-emission laser, a photodiode, or a light-emitting diode. In some embodiments, component 20 is less than one hundred, fifty, forty, thirty, twenty, fifteen, ten, or five microns on a horizontal side, e.g., a length or width. Component 20, sacrificial portion 12, and source wafer 10 were coated with an encapsulation layer 30 of silicon nitride (e.g., $SiO_xN_y$) using plasma-enhanced chemical-vapor deposition (PECVD) to a thickness of 500 nm (e.g., in a range from two hundred nm to two thousand nm or three hundred nm to one thousand nm) and patterned using $CF_4$ (optionally $SF_6$) to pattern vertical tether 46 and vertical portion 40 to a width on sacrificial-portion side 12E (and optionally component side 20E) of (in different embodiments) thirty, sixty and ninety percent of the width or length of component 20 (e.g., in a horizontal direction along sacrificial-portion edge 12E). The structure of FIG. 15A can be etched using HCl to form gap 12G, release component 20 from source wafer 10, and suspend component 20 over gap 12G of sacrificial portion 12 above source wafer 10 with vertical portion 40 of vertical tether 46 physically connecting component 20 to anchor portion 14 of source wafer 10, as shown in FIG. 15B. Component 20 was then micro-transfer-printed to an adhesive layer 52 coated on silicon target substrate 50. Structures corresponding to FIGS. 25C and 25D were also constructed using similar materials.

Target substrate 50 can be coated with an uncured and liquid adhesive layer 52 before component 20 is pressed against target substrate 50 in step 150 so that component 20 is printed to adhesive layer 52 on target substrate 50. Adhesive layer 52 can then be cured. Adhesive layer 52 can be a polymer, for example a curable epoxy, resin, or photoresist that can be cured, for example by UV radiation exposure or heat.

If a vertical tether standoff (a remnant of fractured vertical tether 40F) is present and attached to component 20, the vertical tether standoff can press into liquid adhesive layer 52 (if present) so that component bottom surface 20Z can be disposed substantially parallel to target-substrate surface 54 of target substrate 50 and can completely contact adhesive layer 52, for example as desired, to adhere component 20 to target-substrate surface 54. In the absence of adhesive layer 52 and in the presence of a vertical tether standoff, component bottom surface 20Z could be prevented from closely contacting target-substrate surface 54 and thereby be prevented from adequately adhering to target-substrate surface 54.

In general, depositing and patterning materials and forming structures can be done with conventional photolithographic methods and materials, for example by coating with a photoresist, pattern-wise exposing and developing the photoresist, etching the patterned photoresist, and stripping the photoresist to make a patterned layer. The different layers and structures formed on the process side (source-wafer surface 11 of source wafer 10) can be patterned in separate steps with different etchants and can be patterned into the same pattern or different patterns. Components 20 can be formed on source-wafer surface 11 using photolithographic process and materials. In step 110 one or more dielectric or electrically conductive layers (e.g., including any combination of metal or silicon dioxide, patterned conductors, electrodes, or encapsulation layers 30) can be disposed and patterned on source wafer 10 and sacrificial portion 12 to form component 20 with any electronic circuits.

In embodiments of the present disclosure, component 20 is or comprises an integrated circuit, a digital circuit, a CMOS circuit, a diode, transistor, a photonic structure, a laser, a light-emitting diode, a sensor, a light modulator, a light amplifier, or a photodiode. Component 20 can have a length or width less than or equal to two hundred microns, less than or equal to one hundred microns, less than or equal to fifty microns, less than or equal to twenty microns, less than or equal to ten microns, less than or equal to five microns, or less than or equal to two microns. Component 20 can have a thickness or depth less than or equal to ten nm, twenty nm, fifty nm, one hundred nm, one micron, two microns, five microns, ten microns, twenty microns, or fifty microns. Component 20 can have a length or width less than or equal to two nm, less than or equal to five nm, less than or equal to ten nm, less than or equal to twenty nm, less than or equal to fifty nm, or less than or equal to one hundred nm.

Methods of forming micro-transfer printable structures are described, for example, in the paper AMOLED Displays using Transfer-Printed Integrated Circuits (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby incorporated by reference in its entirety. Additional details useful in understanding and performing aspects of the present disclosure are described in U.S. patent application Ser. No. 14/743, 981, filed Jun. 18, 2015, entitled Micro Assembled LED Displays and Lighting Elements, which is hereby incorporated by reference in its entirety.

Reference is made throughout the present description to examples of printing that are micro-transfer printing with stamp 60 comprising stamp post 62 when describing certain examples of printing components 20. Similar other embodiments are expressly contemplated where a transfer element 60 that is not a stamp is used to similarly print components 20. For example, in some embodiments, a transfer element 60 that is a vacuum-based, magnetic, or electrostatic transfer element 60 can be used to print components 20. A component 20 can be adhered to a transfer element 60 with any type of force sufficient to maintain contact between the component 20 and transfer element 60 when desired and separate transfer element 60 from component 20 when desired. For example, component 20 can be adhered to transfer element 60 with one or more of an adhesion, electrostatic, van der Waals, magnetic, or vacuum force. In some embodiments, adhesion between component 20 and transfer element 60 occurs at least in part due to a force generated by operating transfer element 60 (e.g., an electrostatic force) and separation of transfer element 60 from component 20 occurs at least in part by ceasing provision of the force (e.g., an electrostatic force). A vacuum-based, magnetic, or electrostatic transfer element 60 can comprise a plurality of transfer posts, each transfer post being constructed and arranged to pick up a single component 20 (similarly to stamp posts 62 in stamp 60).

As is understood by those skilled in the art, the terms "over" and "under" and "vertical" and "horizontal" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the disclosure.

PARTS LIST

H horizontal plane
P height
V vertical direction
10 source wafer/source substrate
11 source-wafer surface
12 sacrificial portion
12E sacrificial-portion side/sacrificial-portion edge
12G gap
12S stepped edge
12T sacrificial-portion thickness
14 anchor/anchor portion
20 component
20A doped component layer
20B doped component layer
20E component side/component edge
20T component thickness/component height
20Z component bottom surface
22 contact pad
30 encapsulation layer
40 vertical portion
40F fractured vertical tether
42 fracture line
44 neck
46 vertical tether
50 target substrate
52 adhesive layer/adhesive
54 target-substrate surface
56 mechanical structure
56E mechanical-structure side
58 cavity
60 stamp/transfer element
62 stamp post
70 light pipe 72 light
90 micro-transfer-printable component source structure
92 micro-transfer-printable component target structure
100 provide source wafer step
105 form sacrificial portion step
110 construct component step
115 construct contact pads step
120 deposit tether material step
125 pattern tether material step
130 etch sacrificial portion step
135 contact component with stamp step
140 remove component from substrate with stamp step
145 move component to target substrate with stamp step
150 print component onto target substrate with stamp step
155 remove stamp step
160 micro-transfer electronic circuit from source semiconductor substrate to target substrate
200 contact component vertically to target-substrate surface with stamp step
205 move component horizontally with stamp step
210 contact component horizontally to mechanical-structure side with stamp step
215 press component vertically against target-substrate surface with stamp step

What is claimed:

1. A micro-transfer-printable component source structure, comprising:

a source wafer having a source-wafer thickness extending in a vertical direction to a source-wafer surface comprising an anchor portion;

a sacrificial portion of sacrificial material disposed on only a portion of the source-wafer surface adjacent to the anchor portion, the sacrificial portion having a sacrificial-portion side extending along a sacrificial-portion edge of the sacrificial portion at least partially in the vertical direction;

a component at least partially disposed on the sacrificial portion, the component having a component side extending along a component edge of the component at least partially in the vertical direction; and a vertical tether physically connecting the component to the source-wafer surface, the vertical tether extending from the component along the sacrificial-portion side to the anchor portion and comprising a vertical portion that extends at least partially in the vertical direction such that the vertical portion is in contact with the sacrificial material along the sacrificial-portion side, wherein the component is disposed directly and exclusively on the sacrificial portion or is disposed directly and exclusively on the sacrificial portion in combination with the vertical portion, and wherein the vertical tether extends along and in contact with some but less than all of the component side.

2. The micro-transfer-printable component source structure of claim 1, wherein the component edge extends at an angle no less than 45 degrees from the source-wafer surface or wherein the component edge extends orthogonally from the source-wafer surface.

3. The micro-transfer-printable component source structure of claim 1, wherein the sacrificial-portion edge extends at an angle no less than 45 degrees from the source-wafer surface or wherein the sacrificial-portion edge extends orthogonally from the source-wafer surface.

4. The micro-transfer-printable component source structure of claim 1, wherein the sacrificial portion comprises a sacrificial portion material and the component comprises a component material that is differentially etchable from the sacrificial portion material.

5. The micro-transfer-printable component source structure of claim 1, wherein the vertical tether extends along and on at least a part of the source-wafer surface that is not the sacrificial portion.

6. The micro-transfer-printable component source structure of claim 1, wherein the sacrificial portion comprises a sacrificial portion material and the source wafer comprises a source wafer material that is differentially etchable from the sacrificial portion material.

7. The micro-transfer-printable component source structure of claim 1, wherein the component comprises a component material and the source wafer comprises a source wafer material that is the same as the component material.

8. The micro-transfer-printable component source structure of claim 1, wherein the vertical tether comprises an inorganic material, an organic material, or comprises layers comprising organic and inorganic materials.

9. The micro-transfer-printable component source structure of claim 1, wherein the vertical tether comprises silicon oxide, silicon nitride, an epoxy, polyimide, or a photoresist.

10. The micro-transfer-printable component source structure of claim 1, wherein the sacrificial portion is an etched sacrificial portion forming a gap between the component and the source wafer.

11. The micro-transfer-printable component source structure of claim 1, wherein a portion of the vertical tether that is not over the component extends in the vertical direction a greater distance than in a horizontal direction orthogonal to the vertical direction.

12. The micro-transfer-printable component source structure of claim 1, wherein the vertical tether is constructed to fracture along the sacrificial-portion side.

13. A micro-transfer-printable component source structure, comprising:
   a source wafer having a source-wafer thickness extending in a vertical direction and comprising an anchor portion;
   a sacrificial portion disposed on only a portion of the source wafer adjacent to the anchor portion, the sacrificial portion having a sacrificial-portion side that extends at least partially in the vertical direction;
   a component at least partially disposed on the sacrificial portion, the component having a component side extending along a component edge of the component at least partially in the vertical direction; and
   a vertical tether physically connecting the component to the source wafer, the vertical tether extending from the component along the sacrificial-portion side of the sacrificial portion to the anchor portion and including a vertical portion that extends at least partially in the vertical direction such that the vertical portion is in contact with the sacrificial-portion side of the sacrificial portion,
   wherein the component is disposed directly and exclusively on the sacrificial portion or is disposed directly and exclusively on the sacrificial portion in combination with the vertical portion, and
   wherein the vertical tether extends along and in contact with some but less than all of the component side.

14. A micro-transfer-printable component source structure, comprising:
   a source wafer having a source-wafer thickness extending in a vertical direction to a source-wafer surface comprising an anchor portion;

a sacrificial portion comprising a sacrificial material disposed on only a portion of the source-wafer surface adjacent to the anchor portion, the sacrificial portion having a sacrificial-portion side extending along a sacrificial-portion edge of the sacrificial portion at least partially in the vertical direction;
   a component at least partially disposed on the sacrificial portion, the component having a component side extending along a component edge of the component at least partially in the vertical direction; and
   a vertical tether physically connecting the component to the source-wafer surface, the vertical tether extending from the component along the sacrificial-portion side to the anchor portion and comprising a vertical portion that extends at least partially in the vertical direction,
   wherein the component is disposed directly and exclusively on the sacrificial portion or is disposed directly and exclusively on the sacrificial portion in combination with the vertical portion,
   wherein the vertical tether has a first width on at least a first portion of the sacrificial-portion side that is narrower than a second width on at least a second portion of the sacrificial-portion side, wherein the first portion is different from the second portion.

15. A micro-transfer-printable component source structure, comprising:
   a source wafer having a source-wafer thickness extending in a vertical direction to a source-wafer surface comprising an anchor portion;
   a sacrificial portion comprising a sacrificial material disposed on only a portion of the source-wafer surface adjacent to the anchor portion, the sacrificial portion having a sacrificial-portion side extending along a sacrificial-portion edge of the sacrificial portion at least partially in the vertical direction;
   a component at least partially disposed on the sacrificial portion, the component having a component side extending along a component edge of the component at least partially in the vertical direction; and
   a vertical tether physically connecting the component to the source-wafer surface, the vertical tether extending from the component along the sacrificial-portion side to the anchor portion and comprising a vertical portion that extends at least partially in the vertical direction,
   wherein the component is disposed directly and exclusively on the sacrificial portion or is disposed directly and exclusively on the sacrificial portion in combination with the vertical portion,
   wherein the vertical portion is directly between the component and the source wafer.

16. A micro-transfer-printable component source structure, comprising:
   a source wafer having a source-wafer thickness extending in a vertical direction and comprising an anchor portion;
   a sacrificial portion disposed on only a portion of the source wafer adjacent to the anchor portion, the sacrificial portion having a sacrificial-portion side that extends at least partially in the vertical direction;
   a component at least partially disposed on the sacrificial portion; and
   a vertical tether physically connecting the component to the source wafer, the vertical tether extending from the component along the sacrificial-portion side of the sacrificial portion to the anchor portion and including a vertical portion that extends at least partially in the vertical direction, wherein the component is disposed directly and exclusively on the sacrificial portion or is disposed directly and exclusively on the sacrificial portion in combination with the vertical portion, and wherein the vertical portion is directly between the component and the source wafer.

17. A micro-transfer-printable component source structure, comprising:

a source wafer having a source-wafer thickness extending in a vertical direction to a source-wafer surface comprising an anchor portion;

a sacrificial portion of sacrificial material disposed on only a portion of the source-wafer surface adjacent to the anchor portion, the sacrificial portion having a sacrificial-portion side extending along a sacrificial-portion edge of the sacrificial portion at least partially in the vertical direction;

a component at least partially disposed on the sacrificial portion, the component having a component side extending along a component edge of the component at least partially in the vertical direction; and a vertical tether physically connecting the component to the source-wafer surface, the vertical tether extending from the component along the sacrificial-portion side to the anchor portion and comprising a vertical portion that extends at least partially in the vertical direction such that the vertical portion is in contact with the sacrificial material along the sacrificial-portion side, wherein the component is disposed directly and exclusively on the sacrificial portion or is disposed directly and exclusively on the sacrificial portion in combination with the vertical portion, and wherein the vertical tether has a sacrificial portion width on at least a portion of the sacrificial-portion side that is narrower than a component width on at least a portion of the component side.

\* \* \* \* \*